United States Patent
Kim et al.

(10) Patent No.: US 11,048,395 B2
(45) Date of Patent: *Jun. 29, 2021

(54) DISPLAY APPARATUS FOR SELECTING AND EXECUTING MENU ITEMS ON A USER INTERFACE, AND CONTROLLING METHOD THEREOF

(71) Applicant: SAMSUNG ELECTRONICS CO., LTD., Suwon-si (KR)

(72) Inventors: Jong-hyuk Kim, Seoul (KR); Seung-hyun Moon, Seongnam-si (KR); Dae-hyun Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 466 days.

This patent is subject to a terminal disclaimer.

(21) Appl. No.: 14/993,589

(22) Filed: Jan. 12, 2016

(65) Prior Publication Data
US 2016/0202894 A1 Jul. 14, 2016

(30) Foreign Application Priority Data
Jan. 12, 2015 (KR) ........................ 10-2015-0004256

(51) Int. Cl.
*H04N 21/422* (2011.01)
*H03M 11/10* (2006.01)
(Continued)

(52) U.S. Cl.
CPC ........ *G06F 3/04847* (2013.01); *G06F 3/0482* (2013.01); *G06F 3/0488* (2013.01);
(Continued)

(58) Field of Classification Search
CPC ... G06F 3/04847; G06F 3/0482; G06F 3/0488
(Continued)

(56) References Cited

U.S. PATENT DOCUMENTS

| 6,225,916 | B1 * | 5/2001 | Sugimoto | G08C 19/28 340/12.17 |
| 6,456,276 | B1 * | 9/2002 | Park | G06F 3/0325 345/157 |

(Continued)

FOREIGN PATENT DOCUMENTS

| CN | 101889261 A | 11/2010 |
| CN | 101996049 A | 3/2011 |

(Continued)

OTHER PUBLICATIONS

Communication dated Jun. 16, 2017 issued by the European Patent Office in counterpart European Patent Application No. 16 150 103.6.

(Continued)

*Primary Examiner* — Henry Orr
(74) *Attorney, Agent, or Firm* — Sughrue Mion, PLLC

(57) ABSTRACT

A display device is provided. The display apparatus includes: a display configured to display a user interface screen; an input interface configured to receive a user operation to select and execute at least one menu item included in the user interface screen; and a processor configured to separately recognize a short click and a long press based on an input time of the user operation, constantly maintain an execution speed of a function corresponding to a selected menu item within a preset critical time in the time for which the input of the long press is continued and accelerate the execution speed of the corresponding function after the preset critical time passes.

7 Claims, 29 Drawing Sheets

(51) Int. Cl.
*G06F 3/0484* (2013.01)
*G06F 3/0482* (2013.01)
*G06F 3/0488* (2013.01)
*G06F 3/16* (2006.01)

(52) U.S. Cl.
CPC .......... *G06F 3/04842* (2013.01); *G06F 3/165* (2013.01); *H03M 11/10* (2013.01); *H04N 21/42204* (2013.01); *H04N 21/42215* (2013.01)

(58) Field of Classification Search
USPC ....................................................... 715/716
See application file for complete search history.

(56) References Cited

U.S. PATENT DOCUMENTS

| | | | | |
|---|---|---|---|---|
| 8,640,166 | B1* | 1/2014 | Craner | H04N 21/4826 725/37 |
| 8,780,140 | B2 | 7/2014 | Endo et al. | |
| 2002/0113895 | A1* | 8/2002 | Takagi | H04N 5/50 348/569 |
| 2005/0024545 | A1* | 2/2005 | Borden, IV | G11B 15/023 348/734 |
| 2007/0128899 | A1* | 6/2007 | Mayer | G06F 9/4406 439/152 |
| 2007/0290994 | A1 | 12/2007 | Kawasaki et al. | |
| 2008/0235583 | A1* | 9/2008 | Ostergaard | G11B 27/005 386/343 |
| 2009/0083665 | A1* | 3/2009 | Anttila | G06F 3/0482 715/834 |
| 2009/0195515 | A1* | 8/2009 | Lee | G06F 3/04817 345/173 |
| 2009/0249206 | A1* | 10/2009 | Stahlberg | G11B 27/34 715/716 |
| 2009/0251587 | A1* | 10/2009 | Kim | H04N 5/23293 348/333.12 |
| 2010/0328112 | A1 | 12/2010 | Liu | |
| 2011/0051019 | A1* | 3/2011 | Hardacker | H04N 5/64 348/739 |
| 2011/0131537 | A1* | 6/2011 | Cho | G06F 3/016 715/863 |
| 2012/0144341 | A1 | 6/2012 | Torigoe et al. | |
| 2012/0146925 | A1* | 6/2012 | An | G06F 3/03547 345/173 |
| 2012/0206495 | A1 | 8/2012 | Endo et al. | |
| 2013/0033422 | A1 | 2/2013 | Choi et al. | |
| 2013/0033428 | A1 | 2/2013 | Choi et al. | |
| 2013/0035941 | A1* | 2/2013 | Kim | G06F 3/017 704/275 |
| 2014/0189510 | A1* | 7/2014 | Ozcan | G06F 3/0482 715/716 |
| 2014/0237412 | A1* | 8/2014 | Yoon | G06F 3/04886 715/773 |
| 2015/0033129 | A1* | 1/2015 | Cho | G06F 3/0488 715/728 |

FOREIGN PATENT DOCUMENTS

| | | |
|---|---|---|
| CN | 102073437 A | 5/2011 |
| CN | 102646013 A | 8/2012 |
| CN | 103135818 A | 6/2013 |
| EP | 2 660 702 A2 | 11/2013 |
| KR | 10-2013-0016025 A | 2/2013 |
| WO | 2009/099268 A1 | 8/2009 |

OTHER PUBLICATIONS

Communication from the European Patent Office dated Apr. 4, 2016 in a counterpart European Application No. 116150103.6.
Office Action dated Oct. 30, 2019 by the State Intellectual Property Office of P.R. China in counterpart Chinese Patent Application No. 201610017896.3.
Communication dated May 18, 2020 by the State Intellectual Property Office of P.R. China in counterpart Chinese Patent Application No. 201610017896.3.
Communications dated Jan. 26, 2021 by the Korean Intellectual Property Office in Korean Application No. 10-2020-0021975.
Communication dated Jan. 26, 2021 by the Korean Intellectual Property Office in Korean Application No. 10-2015-004256.

* cited by examiner

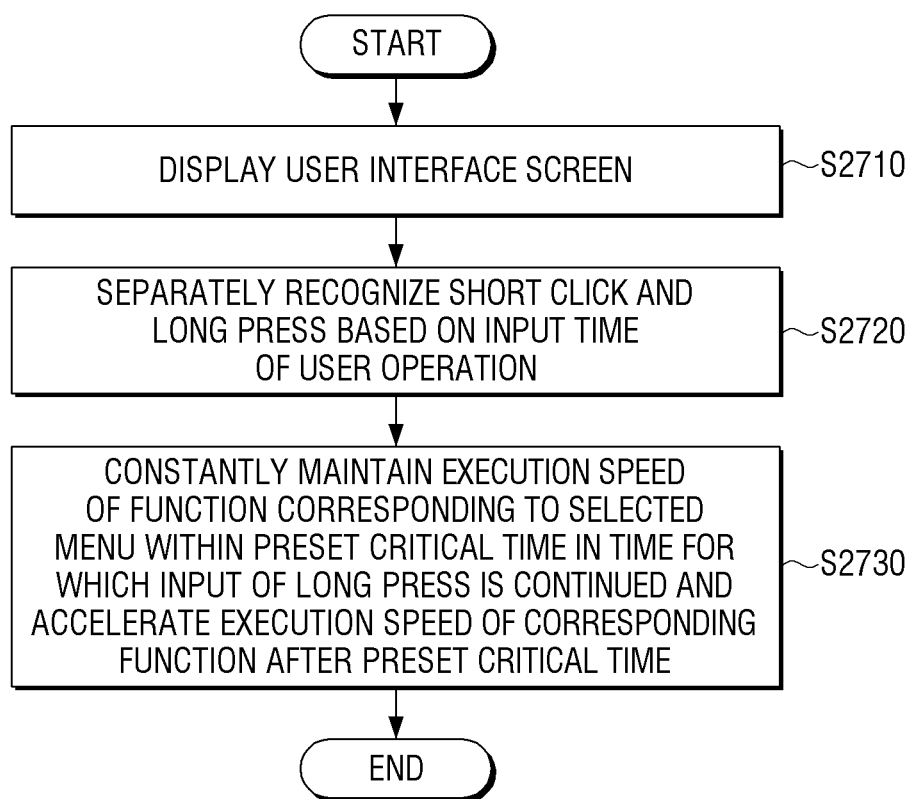

DISPLAY APPARATUS FOR SELECTING AND EXECUTING MENU ITEMS ON A USER INTERFACE, AND CONTROLLING METHOD THEREOF

CROSS-REFERENCE TO RELATED APPLICATIONS

This application claims priority from Korean Patent Application No. 10-2015-0004256, filed on Jan. 12, 2015, in the Korean Intellectual Property Office, the disclosure of which is incorporated herein by reference in its entirety.

BACKGROUND

Field

Apparatuses and methods relate to a display apparatus and a controlling method thereof, and more particularly, to a display apparatus using a single input system and a controlling method thereof.

Description of the Related Art

With the development of electronic technologies, various types of electronic products have been developed and spread. Particularly, various display apparatuses such as TV, a mobile phone, PC, a notebook PC, and PDA are frequently being used in most households.

With an increase in use of the display apparatuses, user's needs for more complex functions have increased. Therefore, manufacturer's attempt to meet the user's needs has led to the emergence of products having new functions that have never existed before.

As a result, functions which are executed by the display apparatus are also diversified. Furthermore, for controlling the functions executed by the display apparatus, the display apparatus or a remote control apparatus frequently use a touch sensor by employing electrical characteristics of a finger, a jog switch, or a plurality of tact switches.

However, when the display apparatus or a remote control apparatus uses the touch sensor, if an insulator is used to perform the touch operation, a touch may not be recognized. On the other hand, when the display apparatus or a remote control apparatus uses the jog switch or the plurality of tact switches, manufacturing costs may be increased or an unnecessarily large area may be required to dispose parts on a circuit board.

As a result, a demand to apply a single input device to the display apparatus or a remote control apparatus, which more intuitively and easily operates the display apparatus, has increased.

SUMMARY OF THE INVENTION

Exemplary embodiments overcome the above disadvantages and other disadvantages not described above. Also, the present invention is not required to overcome the disadvantages described above, and an exemplary embodiment may not overcome any of the problems described above.

According to an embodiment, a technical objective is to provide a display apparatus including an input unit which intuitively and easily operates the display apparatus and a controlling method thereof.

According to an aspect of the present invention, a display apparatus includes: a display configured to display a user interface screen; an input unit configured to receive a user operation to select and execute at least one menu included in the user interface screen; and a processor configured to separately recognize a short click and a long press based on an input time of the user operation, constantly maintain an execution speed of a function corresponding to a selected menu within a preset critical time in the time for which the input of the long press is continued and accelerate the execution speed of the corresponding function after the preset critical time passes.

The processor may constantly maintain a sampling section in which the input of the long press is recognized at a preset size within the preset critical time and change the sampling section in which the input of the long press is recognized to a size which is smaller than the preset size after the preset critical time passes.

The processor may create an on screen display (OSD) which guides functions corresponding to each of the short click and the long press and display the created OSD on the display.

The processor may move a selected GUI for selecting one of at least one menu included in the user interface screen when the user operation is recognized as the short click and select and execute a menu at which the selected GUI is positioned when the user operation is recognized as the long press.

The processor may constantly maintain a channel change speed within the preset critical time and accelerate the channel change speed after the preset critical time when the menu at which the selected GUI is positioned is a channel change menu.

The processor may constantly maintain a volume change speed within the preset critical time and accelerate the volume change speed after the preset critical time when the menu at which the selected GUI is positioned is a volume change menu.

The input unit may include at least one of a single physical function key and a touch panel.

At least one of the single physical function key and the touch panel may be provided on a bezel portion of the display apparatus.

According to another aspect of the present invention, a controlling method of a display apparatus including an input unit which receives a user operation to select and execute at least one menu included in a user interface screen, the controlling method includes: displaying a user interface screen; separately recognizing a short click and a long press based on an input time of the user operation; and constantly maintaining an execution speed of a function corresponding to a selected menu within a preset critical time in the time for which an input of the long press is continued and accelerating the execution speed of the corresponding function after the preset critical time passes.

In the accelerating, a sampling section in which the input of the long press is recognized may be constantly maintained at a preset size within the preset critical time and the sampling section in which the input of the long press is recognized may be changed to a size which is smaller than the preset size after the preset critical time passes.

The controlling method may further include: creating an on screen display (OSD) which guides functions corresponding to each of the short click and the long press and displaying the created OSD.

The controlling method may further include: moving a selected GUI for selecting one of at least one menu included in the user interface screen when the user operation is recognized as the short click and selecting and executing a menu at which the selected GUI is positioned when the user operation is recognized as the long press.

In the accelerating, a channel change speed may be constantly maintained within the preset critical time and the channel change speed may be accelerated after the preset critical time when the menu at which the selected GUI is positioned is a channel change menu.

In the accelerating, a volume change speed may be constantly maintained within the preset critical time and the volume change speed may be accelerated after the preset critical time when the menu at which the selected GUI is positioned is a volume change menu.

The input unit may include at least one of a single physical function key and a touch panel.

At least one of the single physical function key and the touch panel may be provided at a bezel portion of the display apparatus.

According to an aspect of an exemplary embodiment, a display apparatus includes an input unit configured to receive a user operation, and a processor configured to classify the input user operation based on an amount of time of the input user operation, and amplify the functionality of the input user operation after a predetermined amount of time passes.

According to an aspect of an exemplary embodiment, a controlling method of a display apparatus includes receiving a user operation input, classifying the input user operation based on an amount of time of the input user operation, and amplifying the functionality of the input user operation after a predetermined amount of time passes.

Additional and/or other aspects and advantages of the invention will be set forth in part in the description which follows and, in part, will be obvious from the description, or may be learned by practice of the invention.

BRIEF DESCRIPTION OF THE DRAWING FIGURES

The above and/or other aspects of the present invention will be more apparent by describing certain exemplary embodiments of the present invention with reference to the accompanying drawings, in which:

FIG. 27 is a flow chart for describing a controlling method of a display apparatus, according to an exemplary embodiment.

DETAILED DESCRIPTION OF THE EXEMPLARY EMBODIMENTS

Hereinafter, exemplary embodiments will be described in more detail with reference to the accompanying drawings. Further, when it is decided that a detailed description for the known function or configuration related to the present invention may obscure the gist, the detailed description will be omitted. Furthermore, the following terminologies are defined in consideration of the functions in the present invention and may be construed in different ways by the intention of users and operators. Therefore, the definitions thereof should be construed based on the contents throughout the specification. Also, well-known functions or constructions are not described in detail since they would obscure the invention with unnecessary detail.

Figure 1:
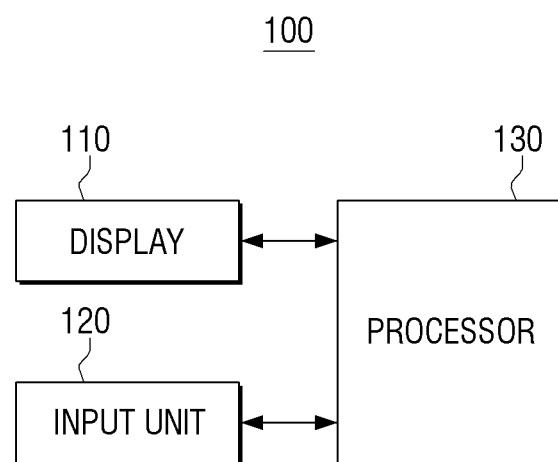
FIG. 1 is a block diagram illustrating a configuration of a display apparatus, according to an exemplary embodiment.

FIG. 1 is a block diagram illustrating a configuration of a display apparatus, according to an exemplary embodiment.

Referring to FIG. 1, a display apparatus 100 is configured to include a display 110, an input unit 120, and a processor 130. The display apparatus 100 may be implemented as various types of electronic devices such as TV, an interactive whiteboard, an electronic table, a large format display (LFD), a smart phone, a tablet, a desk top PC, and a notebook.

The display 110 may display various objects such as all the moving picture images or still images which may be created using a plurality of images such as a movie, a drama, a recorded image, and a slow video, and displayed at a predetermined frame ratio, pictures, and documents. Furthermore, the display 110 may display a user interface screen which includes various kinds of menus. The user interface screen may include various kinds of menus, for example, volume up/down, channel up/down, environment setting menus, and the like, which control the display apparatus 100.

For this purpose, the display 110 may be implemented as a liquid crystal display (LCD), an organic light emitting display (OLED), a plasma display panel (PDP), or the like.

The input unit 120 may receive various user operations which control the display apparatus 100. In particular, the input unit 120 may receive the user operation which selects and carries out at least one menu which is included in the user interface screen displayed on the display 110.

Further, the input unit 120 according to the exemplary embodiment includes at least one of a single physical function key and a touch panel.

Further, the single physical function key refers to a hot key, a one key, and a single key.

Meanwhile, the processor 130 may separately recognize a short click and a long press based on an input time of a user operation which is input through the input unit 120. The short click and the long press will be described in detail with reference to FIGS. 2A and 2B.

Figure 2A:
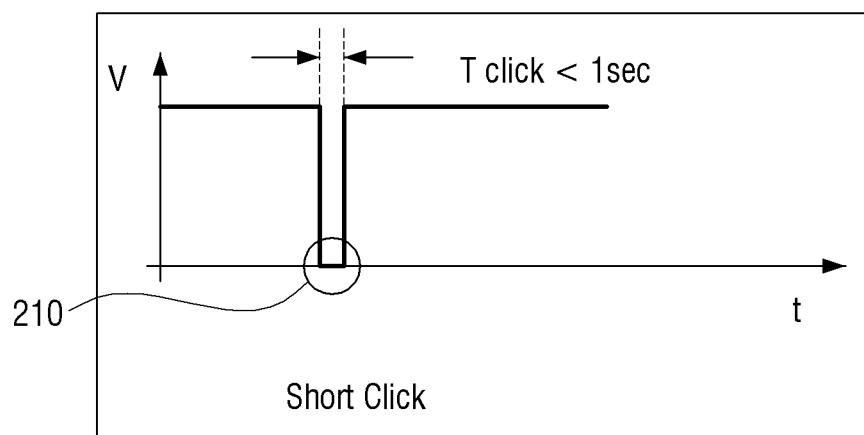
FIGS. 2A and 2B are diagrams for describing a short click and a long press, according to an exemplary embodiment.
Figure 2B:
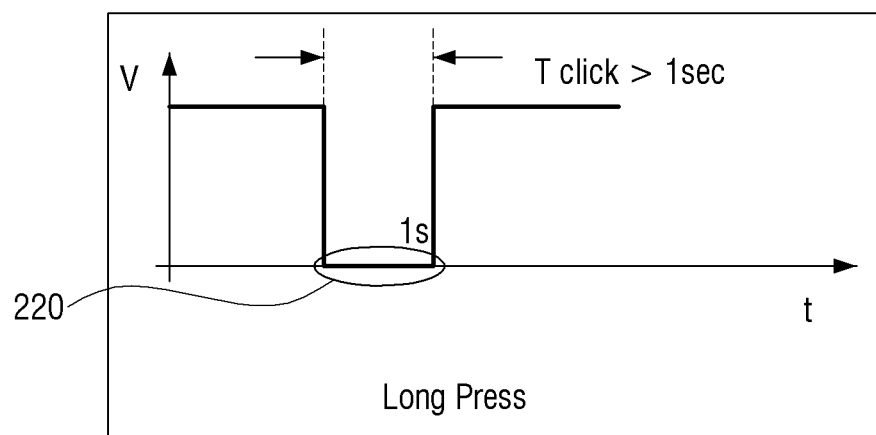

FIGS. 2A and 2B are diagrams for describing the short click and the long press, according to the exemplary embodiment.

Referring to FIGS. 2A and 2B, when the user operation is not input, a voltage V is maintained at a predetermined constant value and sections 210 and 220, in which a voltage is reduced, are created as long as the user operation is input, according to an exemplary embodiment.

When the user operation is input, if the sections 210 and 220, in which the corresponding voltage is reduced, are within 1 second, the processor 130 recognizes the user operation as the short click, and if the sections 210 and 220, in which the voltage is reduced, exceed 1 second, the processor 130 recognizes the user operation as the long press.

FIGS. 2A and 2B are diagrams for separately describing the short click and the long press depending on whether the time taken to input the user operation exceeds 1 second or not, however, the time taken to input the user operation for distinguishing the short click and the long press is not limited to 1 second and therefore may be changed depending on the user setting.

The processor 130 may carry out different functions corresponding to each of the short click and the long press which are separately recognized depending on the input time of the user operation, which will be described below.

Furthermore, the processor 130 may constantly keep an execution speed of the functions corresponding to the selected menu within a preset critical time, in a time for which the input of the long press is continued, and may accelerate the execution speed of the corresponding function after the preset critical time.

That is, the processor 130 may make the execution speeds of the functions, which correspond to the selected menu within the preset critical time and after the preset critical time in the time for which the input of the long press is continued under the condition that the long press is input, different from each other. How to discriminate the section within the preset critical time and the section after the preset critical time in the time for which the input of the long press is continuously input will be described with reference to FIGS. 3A and 3B.

Figure 3A:
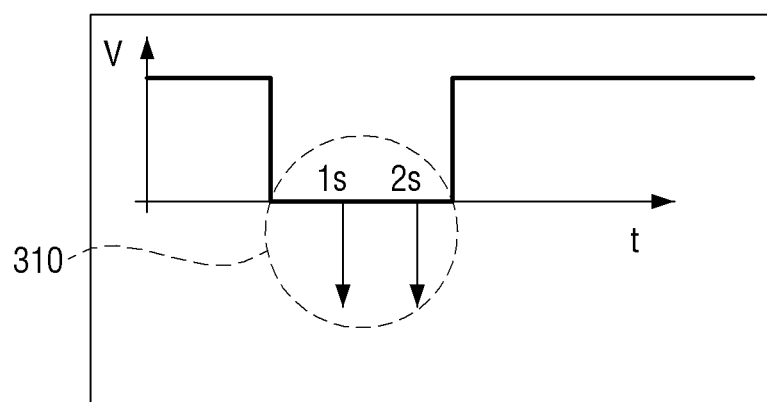
FIGS. 3A and 3B are diagrams for describing an example of the long press, according to the exemplary embodiment.
Figure 3B:
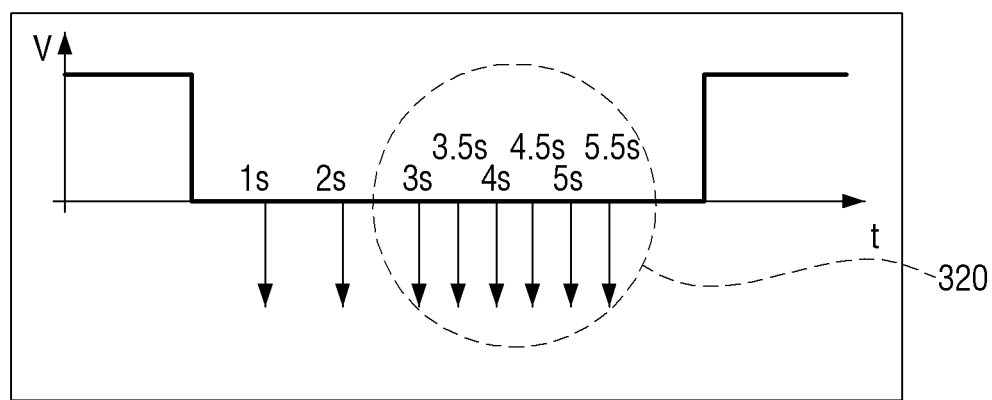

FIGS. 3A and 3B are diagrams for describing an example of the long press, according to the exemplary embodiment.

Referring to FIG. 3A, in the section 310, within the preset critical time in the time for which the input of the long press is continued, a control function may be executed every 1 second. Referring to FIG. 3B, in the section 320, after the preset critical time in the time for which the input of the long press is continued, the control function may be executed every 0.5 seconds, which are smaller than 1 second, according to an exemplary embodiment.

The processor 130 may execute the control function every 1 second in the section 310, within the preset critical time in the time for which the input of the long press is continued to keep the execution speed of the function corresponding to the selected menu constant, and may execute the control function every 0.5 seconds which is smaller than 1 second in the section 320, after the preset critical time to accelerate the execution speed of the functions corresponding to the selected menu.

For example, when the selected menu is the volume up menu, the processor 130 executes the control function every 1 second in the section 310, within the preset critical time in the time for which the input of the long press is continued to sequentially increase volume intensity, such as 1, 2, 3, 4, . . . , and executes the control function every 0.5 seconds, which is smaller than 1 second, in the section 320, after the preset critical time in the time for which the input of the long press is continued to more rapidly increase the volume intensity like 7, 10, 15, 22, . . . , according to an exemplary embodiment.

Specifically, the processor 130 may constantly keep a sampling section in which the input of the long press is recognized at a preset size within the preset critical time, and may change the sampling section in which the input of the long press is recognized to a size which is smaller than the preset size, after the preset critical time.

That is, the processor 130 sets the sampling section in which the input of the long press is recognized at the interval of 1 second within the preset critical time to execute the sampling so as to recognize that the long press is continuously input, thereby executing the control function every 1 second, according to an exemplary embodiment.

Furthermore, the processor 130 sets the sampling section in which the input of the long press is recognized at an interval of 0.5 seconds, which is smaller than 1 second, after the preset critical time to execute the sampling so as to recognize that the long press is continuously input, thereby executing the control function every 0.5 seconds, according to an exemplary embodiment.

Although FIGS. 3A and 3B describe that the control function is executed every 1 second in the section 310, within the preset critical time in the time for which the input of the long press is continued and the control function is executed every 0.5 seconds, which is smaller than 1 second, in the section 320, after the preset critical time, the interval in which the control function is executed is not limited to 1 second and 0.5 seconds and may be smaller or larger.

Furthermore, FIGS. 3A and 3B describe that the preset critical time is set to be 2 seconds. However, the preset critical time may be changed depending on the user settings. For example, as the user increases the preset critical time, the input of the long press needs to be relatively longer continuing to accelerate the execution speed of the functions corresponding to the selected menu.

Meanwhile, in the foregoing example, the processor 130 is a component which generally serves to control apparatuses and may be used as a central processing unit, a microprocessor, a controller, and the like and may control an overall operation of the apparatuses and may be implemented as a system-on-a-chip or system on chip (SOC, SoC).

Figure 4:
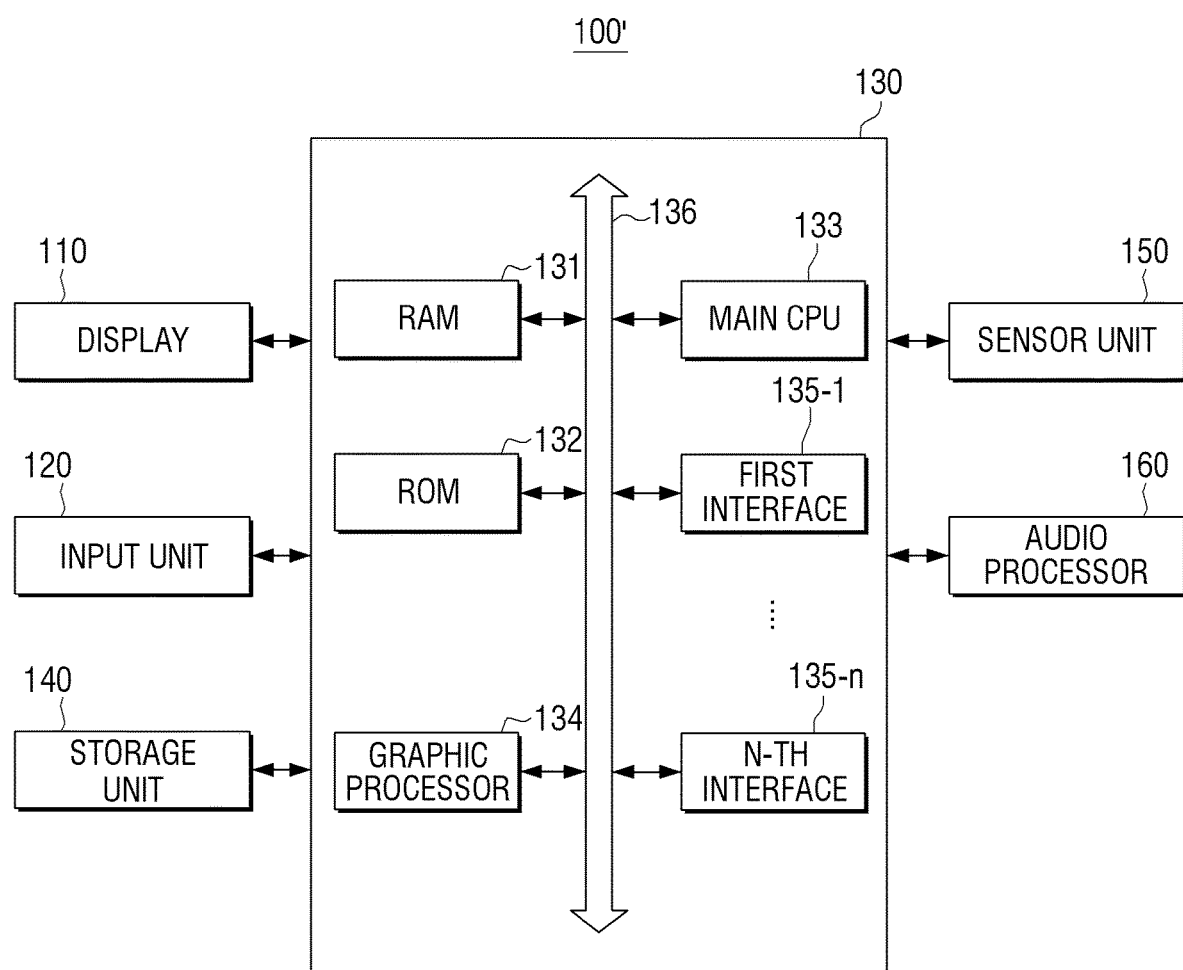
FIG. 4 is a block diagram illustrating a detailed configuration of the display apparatus illustrated in FIG. 1, according to an exemplary embodiment.

FIG. 4 is a block diagram illustrating a detailed configuration of the display apparatus illustrated in FIG. 1, according to an exemplary embodiment.

Referring to FIG. 4, a display apparatus 100 is configured to include the display 110, the input unit 120, and the processor 130, a storage unit 140, a sensor unit 150, and an audio processor 160. A detailed description of components illustrated in FIG. 4, which overlap the components illustrated in FIG. 1, will be omitted.

The processor 130 controls the operation of the display apparatus 100 as a whole.

The processor 130 may include a RAM 131, a ROM 132, a main CPU 133, a graphic processor 134, first to n-th interfaces 135-1 to 135-*n*, and a bus 136, according to an exemplary embodiment.

The RAM 131, the ROM 132, the main CPU 133, the graphic processor 134, the first to n-th interfaces 135-1 to 135-*n*, and the like may be connected to each other via the bus 136.

The first to n-th interfaces 135-1 to 135-*n* are connected to the foregoing various components. One of the interfaces may be a network interface which is connected to the external apparatuses through a network.

The main CPU 133 accesses the storage unit 140 to execute booting using the O/S stored in the storage unit 140. Further, the main CPU 133 executes various operations using various programs, contents, data, and the like which are stored in the storage unit 170, according to an exemplary embodiment.

A set of commands for system booting, and the like may be stored in the ROM 132. When a turn on command is input, in-turn inputting the power, the main CPU 133 copies an O/S stored in the storage unit 140 to the RAM 131 according to the command stored in the ROM 132 and executes the O/S to boot the system. When the booting is completed, the main CPU 133 copies various application programs stored in the storage unit 140 to the RAM 131 and executes application programs copied to the RAM 131 to execute various operations, according to an exemplary embodiment.

The graphic processor 134 uses an operator (not illustrated) and a renderer (not illustrated) to create a screen including various objects such as an icon, an image, and a text. The operator (not illustrated) operates attribute values, such as coordinate values, forms, sizes, and colors which will be displayed by each object according to a layout of the screen, based on the received control command, according to an exemplary embodiment. The renderer (not illustrated) creates the screen of various layouts including an object based on the attribute values which are operated by the operator (not illustrated), according to an exemplary embodiment. The screen created by the renderer (not illustrated) may be displayed on the display 110, according to an exemplary embodiment.

The foregoing operation of the processor 130 may be executed by programs which are stored in the storage unit 140.

The storage unit 140 stores various data such as an operation system (O/S) software module for driving the display apparatus 100', and various kinds of multimedia contents, according to an exemplary embodiment.

Specifically, the storage unit 140 includes various software modules which allow the processor 130 to separately recognize the short click and the long press based on the input time of the user operation, constantly maintain the execution speed of the function corresponding to the selected menu within the preset critical time in the time for which the input of the long press is continued, and accelerate the execution speed of the corresponding function after the preset critical time, according to an exemplary embodiment. This will be described in more detail below with reference to FIG. 5.

The sensor unit 150 may include various kinds of sensors, for example, a touch sensor for recognizing a touch, a motion sensor for sensing a motion of a user, and the like.

The audio processor 160 may process an audio signal to meet user setting about an output range of a speaker unit 110 and a sound quality.

Figure 5:
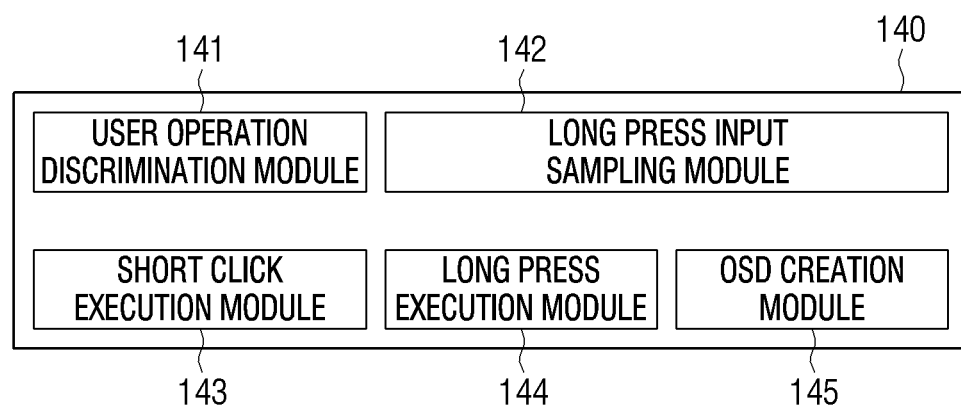
FIG. 5 is a diagram illustrating a software module stored in a storage unit, according to an exemplary embodiment.

FIG. 5 is a diagram illustrating the software module stored in the storage unit, according to an exemplary embodiment.

Referring to FIG. 5, the storage unit 140 may store programs such as a user operation discrimination module 141, a long press input sampling module 142, a short click execution module 143, a long press execution module 144, an OSD creation module 145, and the like.

The foregoing operation of the processor 130 may be executed by programs which are stored in the storage unit 140. The detailed operation of the processor 130, using the programs stored in the storage unit 140, will be described below in detail.

The user operation discrimination module 141 may execute a function of discriminating the short click and the long press depending on the input time of the user operation. For example, the user operation discrimination module 141 may perform a function of recognizing the case in which the input time of the user operation does not exceed 1 second as the short click and the case in which the input time of the user operation exceeds 1 second as the long press.

The long press input sampling module 142 may execute a function of constantly maintaining the sampling section in which the long press input is recognized at a preset size to execute the sampling within the preset time in the time for which the input of the long press is continued and changing the sampling section in which the input of the long press is recognized to a smaller size than the preset size to execute the sampling after the preset critical time.

The short click execution module 143 and the long press execution module 144 may execute functions of executing the control commands corresponding to the recognized short click and long press.

The on screen display (OSD) creation module 145 may execute a function of creating an OSD which is displayed on the display 110.

As such, the processor 130 may use various software modules stored in the storage unit 140 to separately recognizes the short click and the long press based on the input time of the user operation and adjust the execution speeds of the functions corresponding to the selected menus within the preset critical time and after the preset critical time in the time for which the input of the long press is continued to be different.

The processor 130 may create the on screen display (OSD) which guides the functions corresponding to each of the short click and the long press and display the created OSD on the display 110.

Figure 6:
FIG. 6 is a diagram for describing an example of an OSD, according to an exemplary embodiment.

FIG. 6 is a diagram for describing an example of the OSD, according to an exemplary embodiment. Referring to FIG. 6, an OSD 610 displays that the function corresponding to the short click is a function of moving a selected GUI and the function corresponding to the long press is a function of selecting and executing a menu at which the selected GUI is positioned.

Furthermore, graphics displaying that shortly pressed item is the short click and long pressed item is the long press, displayed beside each of the short click and the long press. Using this, the user may easily recognize a method for inputting the short click and the long press. The user may also easily recognize what the functions corresponding to each of the input short click and long press are.

When the user operation is recognized as the short click, the processor 130 may move the selection GUI for selecting one of at least one menu included in the user interface screen and when the user operation is recognized as the long press, the processor 130 may select and execute the menu at which the selection GUI is positioned. This will be described in more detail below, with reference to FIG. 7.

Figure 7:
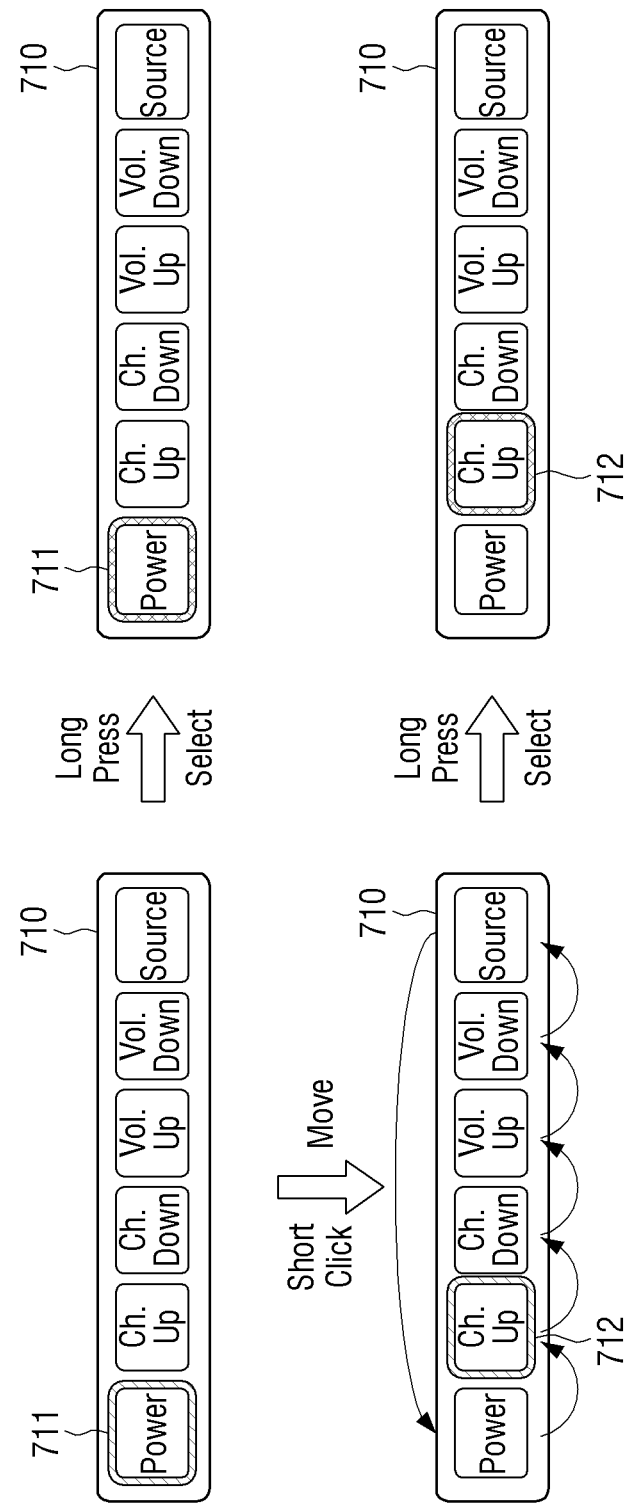
FIG. 7 is a diagram for describing functions executed by the short click or the long press, according to the exemplary embodiment.

FIG. 7 is a diagram for describing functions executed by the short click or the long press, according to the exemplary embodiment.

Referring to FIG. 7, when the short click is recognized in the state in which a selected GUI on a user interface screen 710 including a plurality of menus is positioned at a power menu 711, the processor 130 moves the selected GUI to be positioned at a channel up menu 712. That is, the selected GUI moves by one blank whenever the short click is recognized, and thus is positioned at other menus.

When the long press is recognized in the state in which the selected GUI on the user interface screen 710 including the plurality of menus is positioned at a power menu 711, the processor 130 may execute one of the power on/off functions corresponding to the power menu 711 at which the selected GUI is positioned. If the display apparatus is currently in a turned on state and the processor 130 may execute a power off function when the long press is recognized, according to an exemplary embodiment.

Further, when the short click is recognized in the state in which the selection GUI on the user interface screen 710 including a plurality of menus is positioned at the power menu 711, the processor 130 moves the selection GUI to be positioned at a channel up menu 712 and then when the long press is recognized, the processor 130 may execute a function of increasing a channel number corresponding to the channel up menu 712 at which the selected GUI is positioned, according to an exemplary embodiment.

Furthermore, the processor 130 may constantly keep a speed of increasing the channel number within the preset critical time in the time for which the input of the long press is continued and accelerate the speed of increasing the channel number after the preset critical time.

Further, the processor 130 changes a color of the selection GUI when the long press is recognized while moving the selection GUI to another menu by the short click to recognize the long press, thereby displaying that the function corresponding to the currently selected menu is executing, according to an exemplary embodiment.

Here, the selected GUI is implemented as a form enclosing the menu, but may be implemented by an arrow like a cursor and may also be implemented by changing a color of a menu.

Further, when the user input is not input for the preset time, the user interface screen 710 including the plurality of menus is faded out and thus disappears, according to an exemplary embodiment.

Specifically, the processor 130 may constantly maintain a channel change speed within the preset critical time and accelerate the channel change speed after the preset critical time when the menu at which the selection GUI is positioned is a channel change menu.

FIGS. 8 to 14 are diagrams for describing the channel change, according to an exemplary embodiment.

Figure 8:
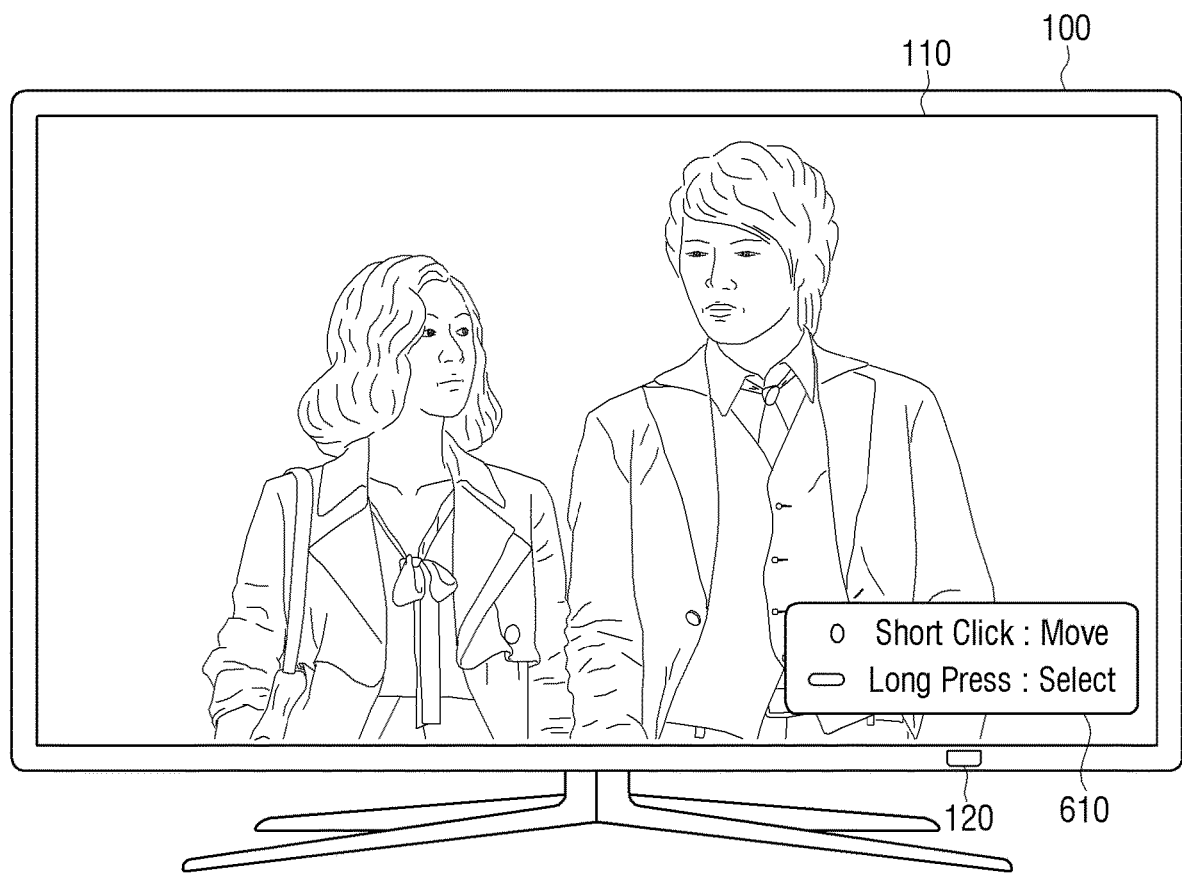
FIGS. 8 to 14 are diagrams for describing a channel change, according to an exemplary embodiment.

Referring to FIG. 8, the processor 130 displays the OSD, which guides functions corresponding to each of the short click and the long press, on the display 110 of the display apparatus 100 when the short click is input through the input unit 120, according to an exemplary embodiment.

Figure 9:
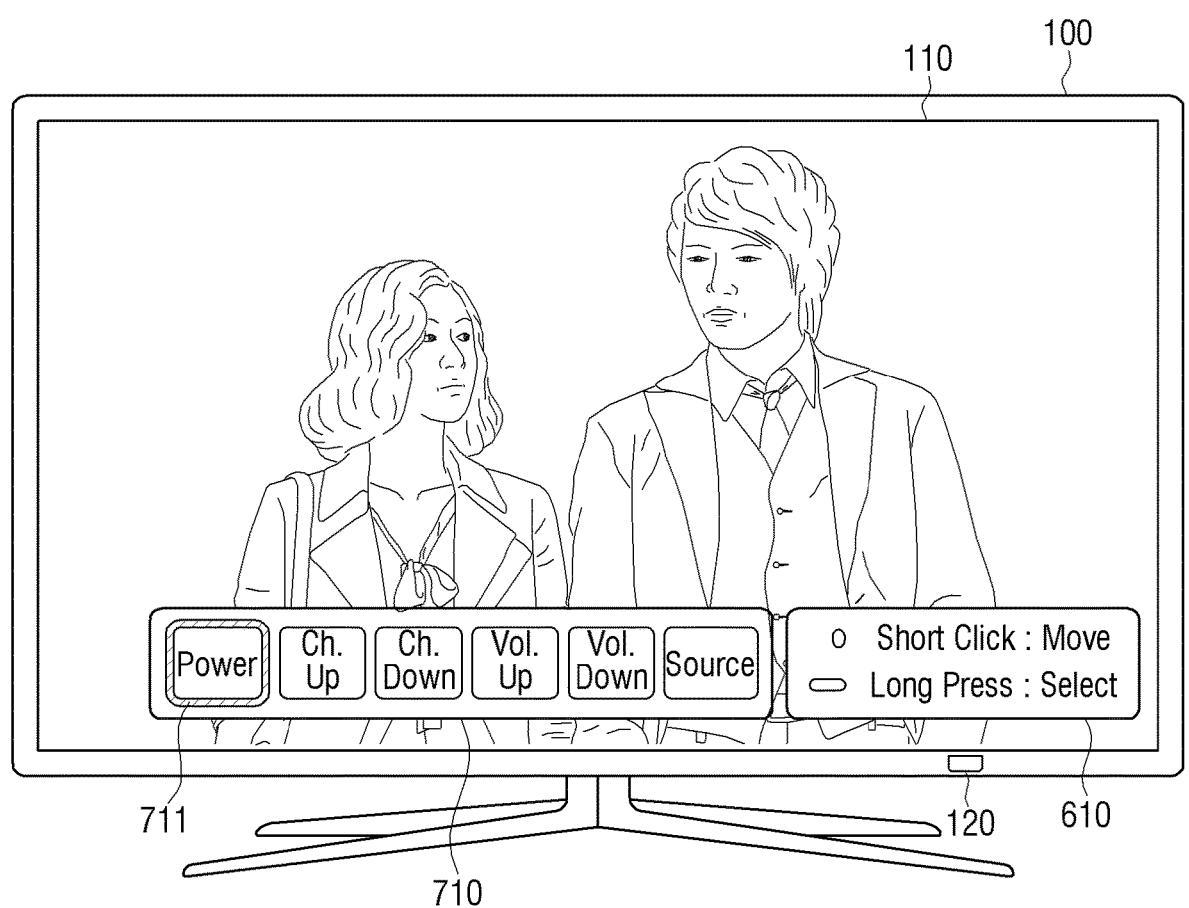

Referring to FIG. 9, the processor 130 displays the user interface screen 710 including at least one menu on the display 110 of the display apparatus 100 when the short click is again input through the input unit 120 and may appreciate that the selected GUI is positioned at the power menu which is first disposed on the user interface screen 710, according to an exemplary embodiment.

Figure 10:
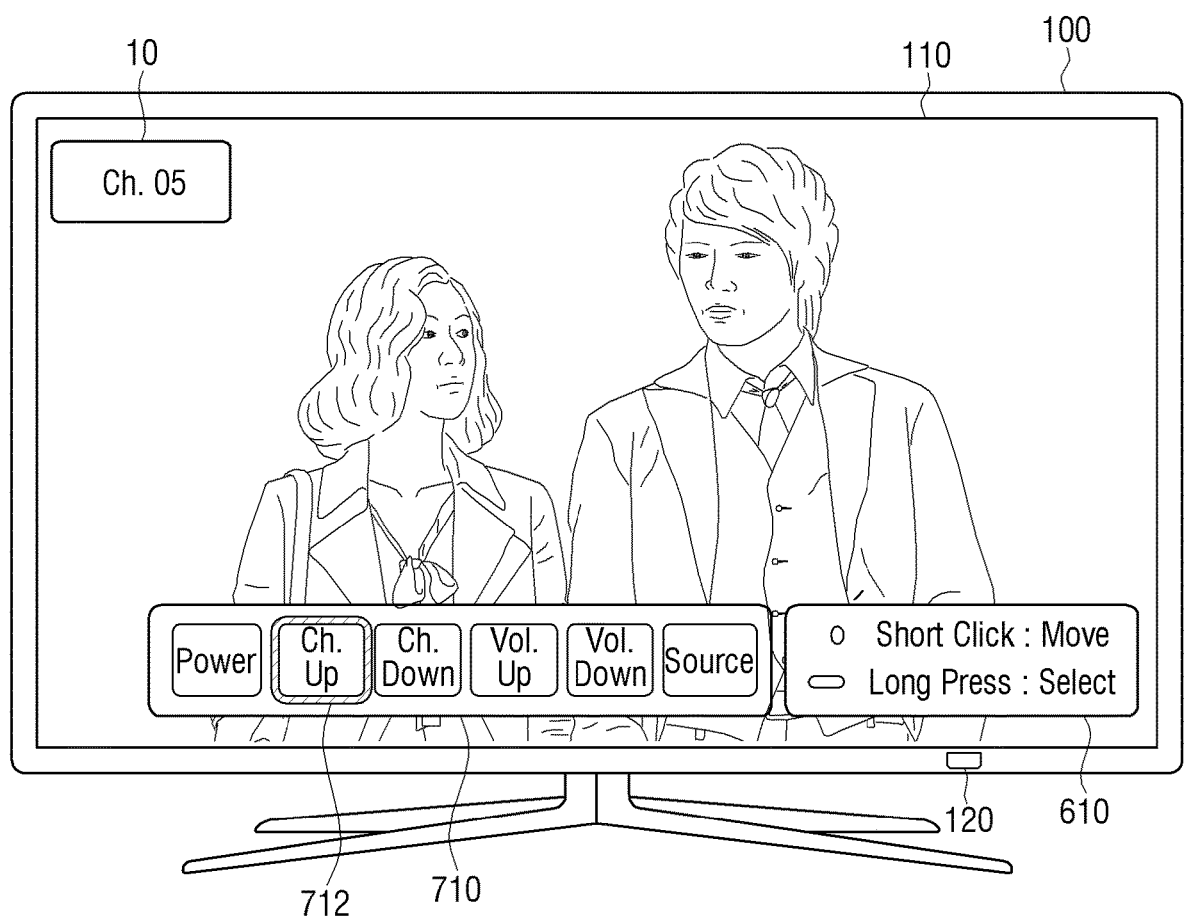

Referring to FIG. 10, the processor 130 moves the selection GUI from the power menu 711 included in the user interface screen 710 to the channel up menu 712 when the short click is again input through the input unit 120, according to an exemplary embodiment. In this case, the OSD 10 indicating what number the current channel is may be created and displayed. FIG. 10 displays the OSD 10 indicating that a channel number which is currently depicting "5".

Figure 11:
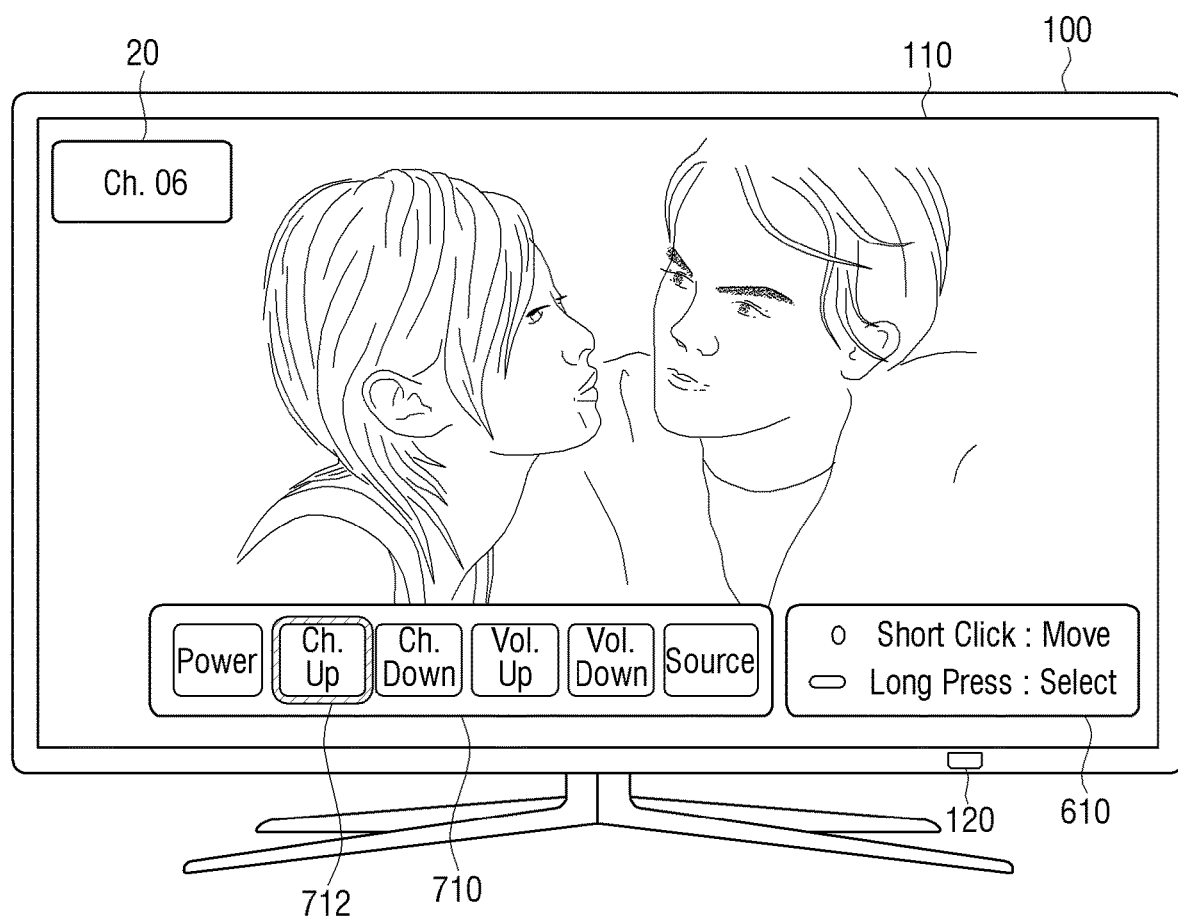

Referring to FIG. 11, the processor 130 executes the function corresponding to the channel up menu at which the selection GUI is positioned, that is, the function of increasing the channel number when the long press is input through the input unit 120, thereby displaying the OSD 20 indicating that the current channel number is changed to number 6, according to an exemplary embodiment.

Figure 12:
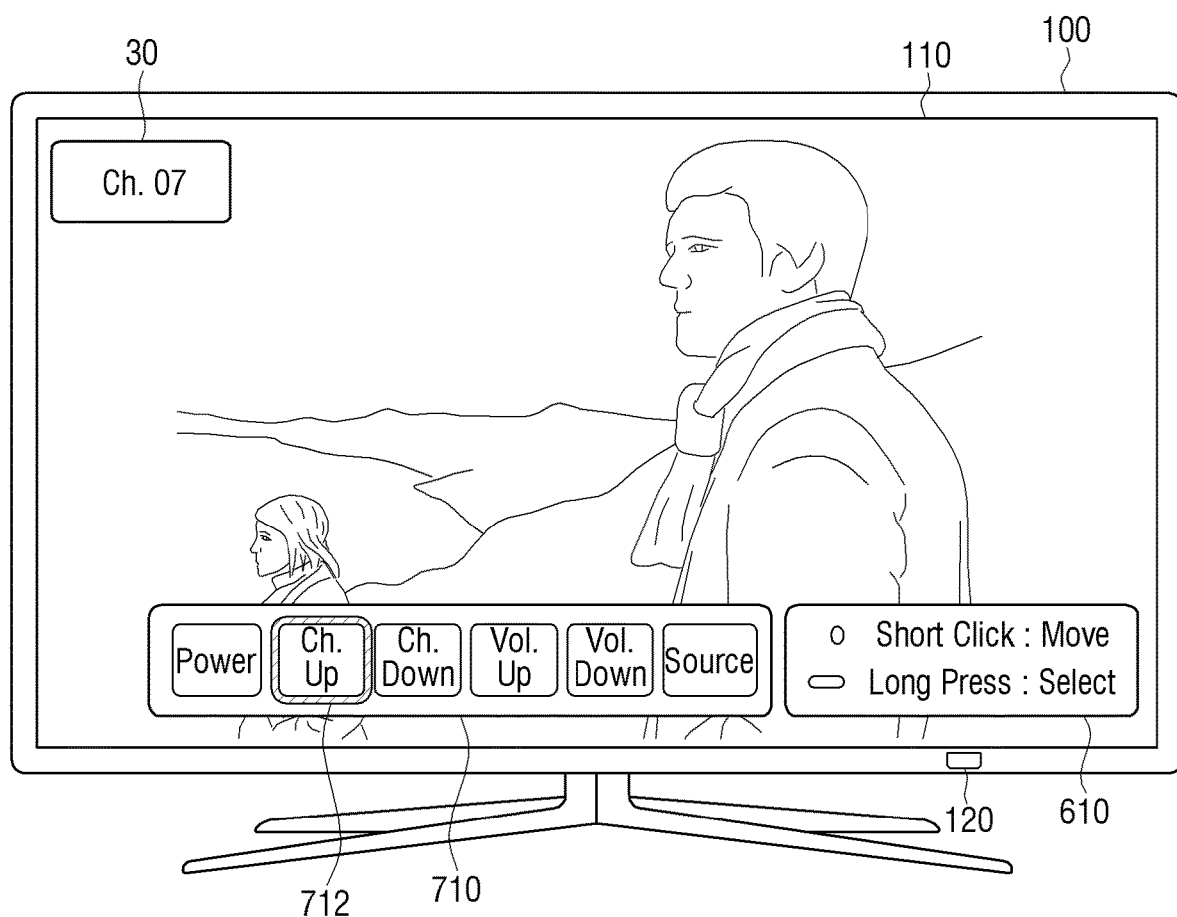

Referring to FIG. 12, the processor 130 recognizes that the long press is continuously input through the input unit 120 to perform the function of continuously increasing the channel number, thereby displaying the OSD 30 indicating that the current channel number is changed to number 7, according to an exemplary embodiment.

Figure 13:
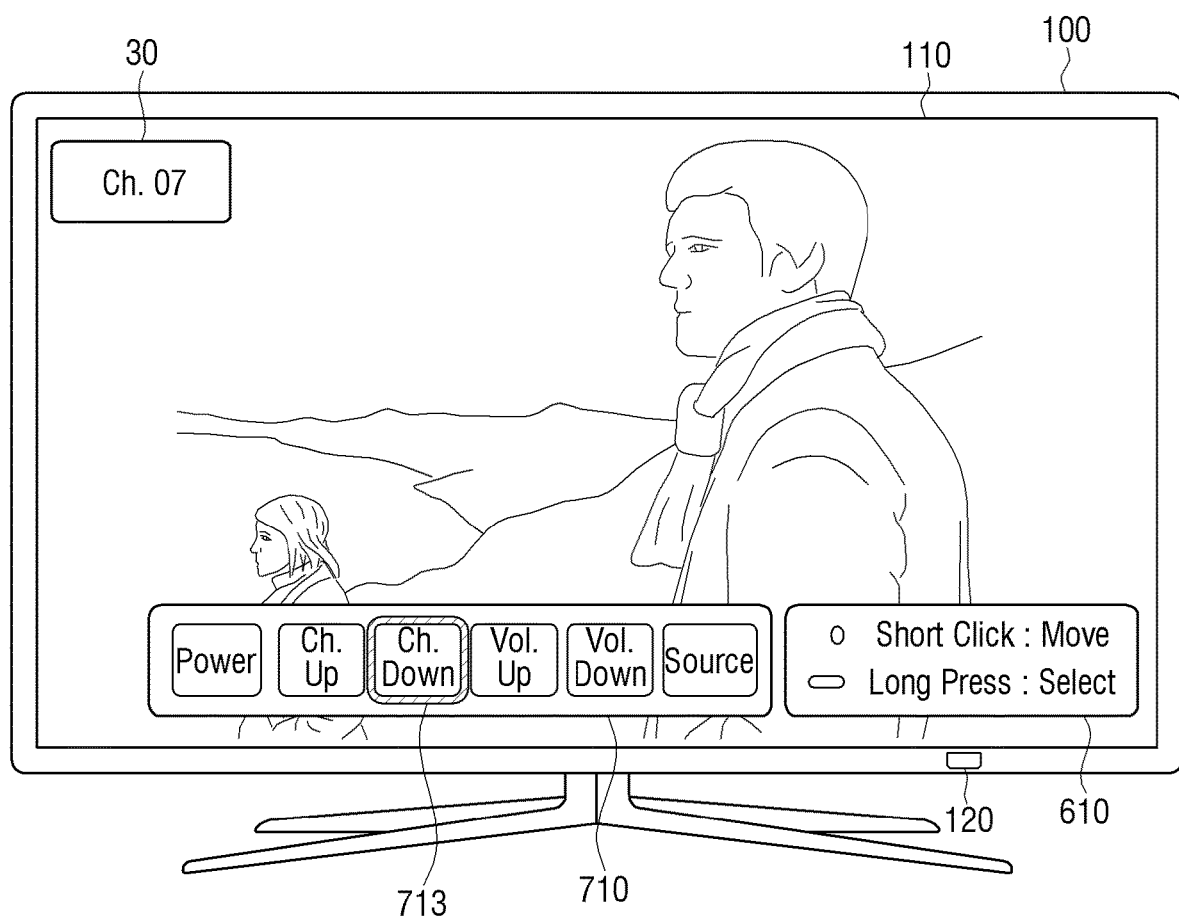

Referring to FIG. 13, the processor 130 may move the selection GUI from the channel up menu 712 included in the user interface screen 710 to a channel down menu 713 when the short click is input through the input unit 120, according to an exemplary embodiment. In this case, the processor 130 displays the OSD 30 indicating that the current channel number is number 7.

Figure 14:
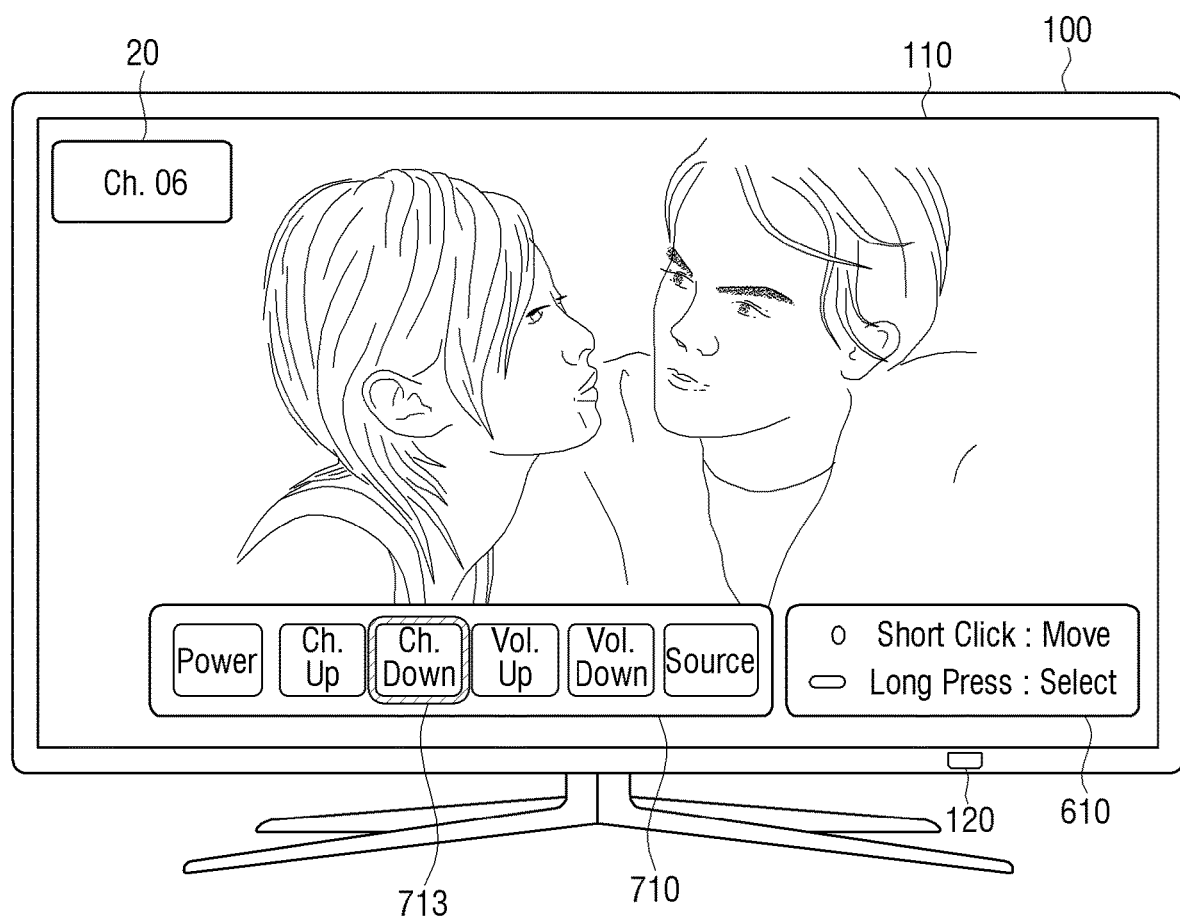

Referring to FIG. 14, the processor 130 executes the function corresponding to the channel down menu at which the selection GUI is positioned, that is, the function of lowering the channel number when the long press is input through the input unit 120, thereby displaying the OSD 20 indicating that the current channel number is changed to number 6, according to an exemplary embodiment.

Meanwhile, referring to FIGS. 8 to 14, when the long press is input, the processor 130 may sequentially increase channel numbers to numbers 5, 6, and 7 as illustrated in FIGS. 10, 11, and 12 within the preset critical time and, although not illustrated in the drawings, may increase the speed of surfing through numbers, such as 7, 10, and 15, without sequentially increasing the channel numbers as illustrated in FIGS. 10, 11, and 12 after the preset critical time. Furthermore, even in the case of lowering the channel number as illustrated in FIG. 14, when the long press is input, the channel number may be sequentially lowered within the preset critical time but the speed of lowering the channel number may be increased after the preset critical time.

The processor 130 may constantly maintain a volume change speed within the preset critical time and accelerate the volume change speed after the preset critical time when the menu at which the selected GUI is positioned is the volume change menu.

FIGS. 15 to 24 are diagrams for describing the volume change, according to an exemplary embodiment.

Figure 15:
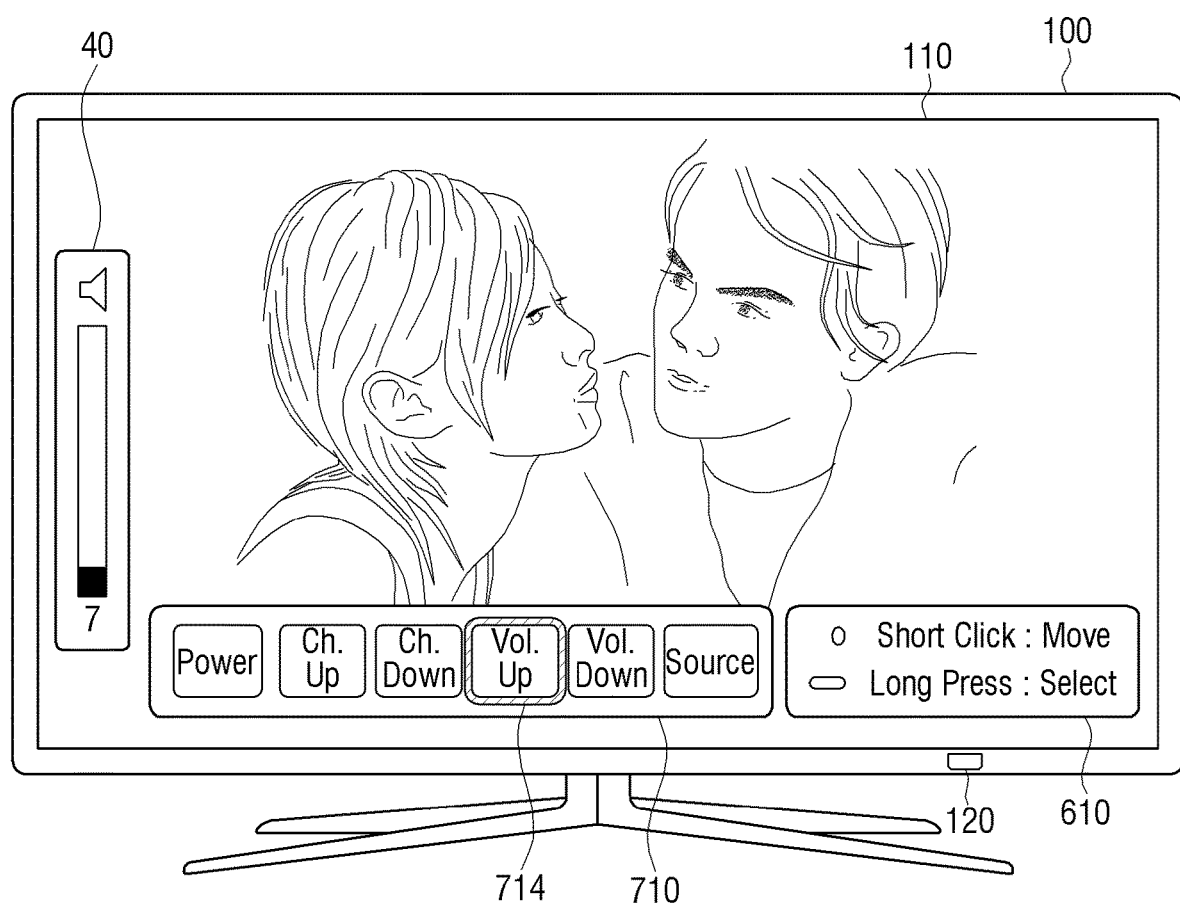
FIGS. 15 to 24 are diagrams for describing a volume change, according to an exemplary embodiment.

Referring to FIG. 15, the processor 130 moves the selected GUI from the channel down menu 713 included in the user interface screen 710 to the volume up menu 714 when the short click is input through the input unit 120, according to an exemplary embodiment. In this case, the processor may display the OSD 40 indicating the current volume intensity. In FIG. 15, the OSD 40 indicating that the current volume intensity is 7 is displayed.

Figure 16:
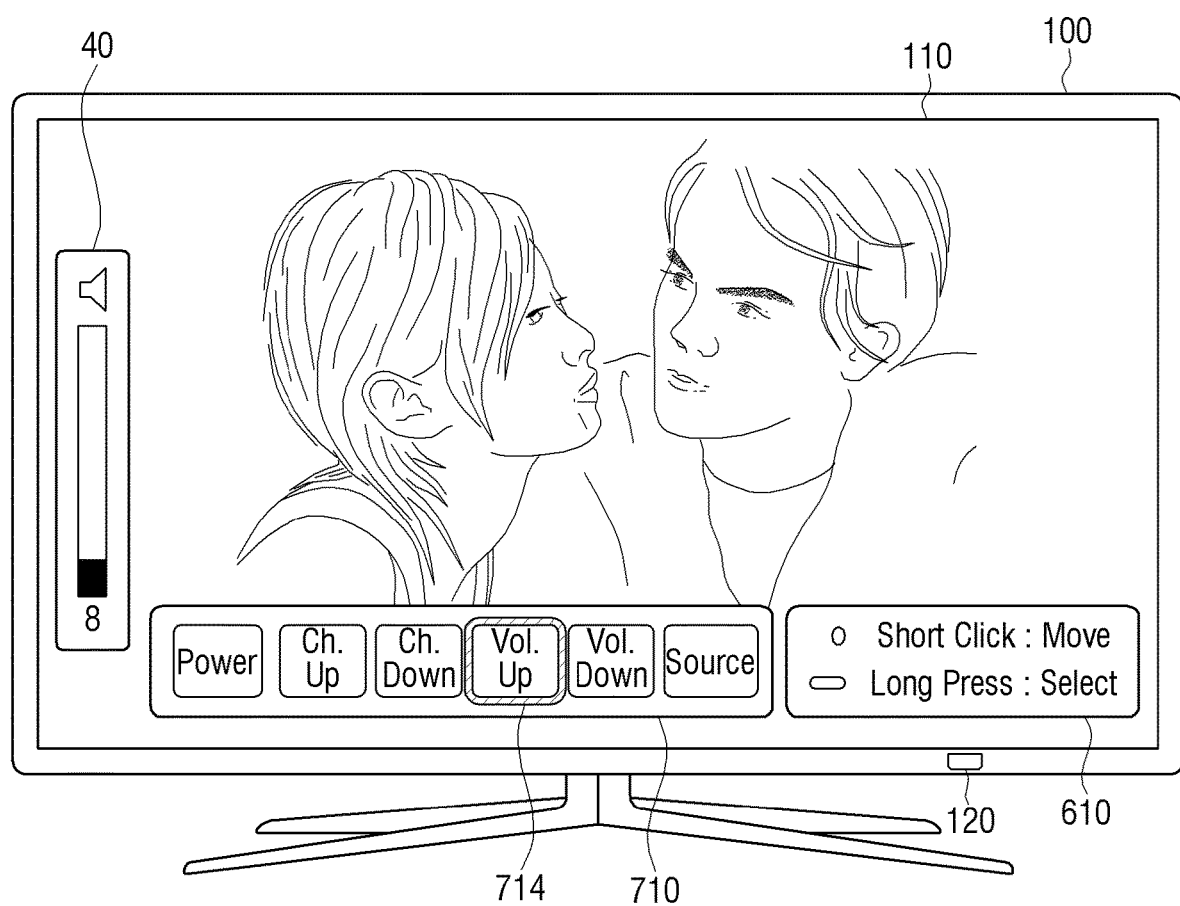

Further, referring to FIG. 16, the processor 130 executes the function corresponding to the volume up menu at which the selection GUI is positioned, that is, the function of increasing the volume intensity when the long press is input through the input unit 120, thereby displaying the OSD 40 indicating that the current volume intensity is changed to 8, according to an exemplary embodiment.

Figure 17:
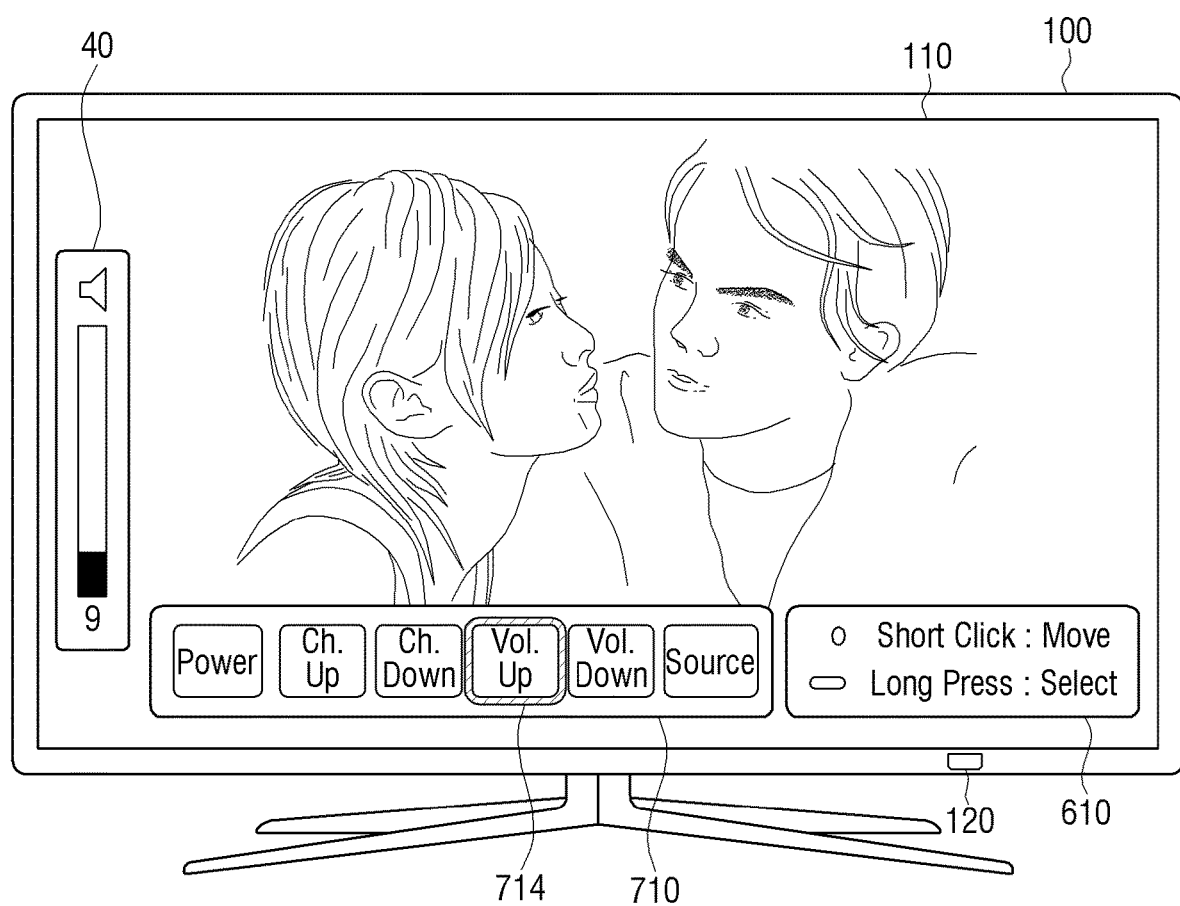

Referring to FIG. 17, the processor 130 recognizes that the long press is continuously input through the input unit 120 and performs a function of sequentially and continuously increasing the volume intensity when the input time of the long press does not exceed the preset critical time, thereby displaying the OSD 40 indicating that the current volume intensity is changed to 9, according to an exemplary embodiment.

Figure 18:
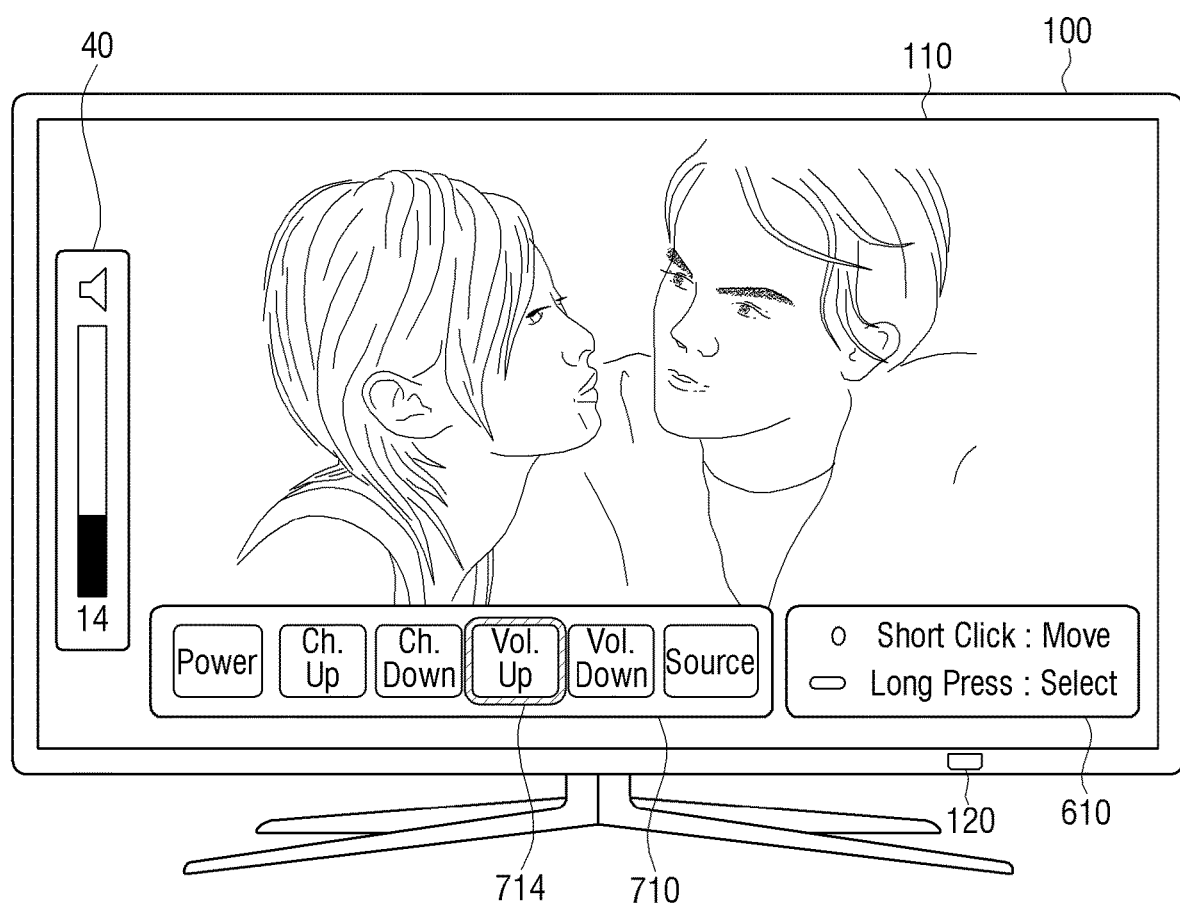

Referring to FIG. 18, the processor 130 recognizes that the long press is continuously input through the input unit 120 and may accelerate the speed of increasing the volume intensity without sequentially and continuously increasing the volume intensity when the input time of the long press exceeds the preset critical time, thereby displaying the OSD 40 indicating that the current volume intensity is changed to 14, according to an exemplary embodiment. That is, when the input time of the long press exceeds the preset critical time, the processor 130 accelerates the increasing speed without sequentially changing the volume intensity from 9 to 10 to change the volume intensity directly to 14.

Figure 19:
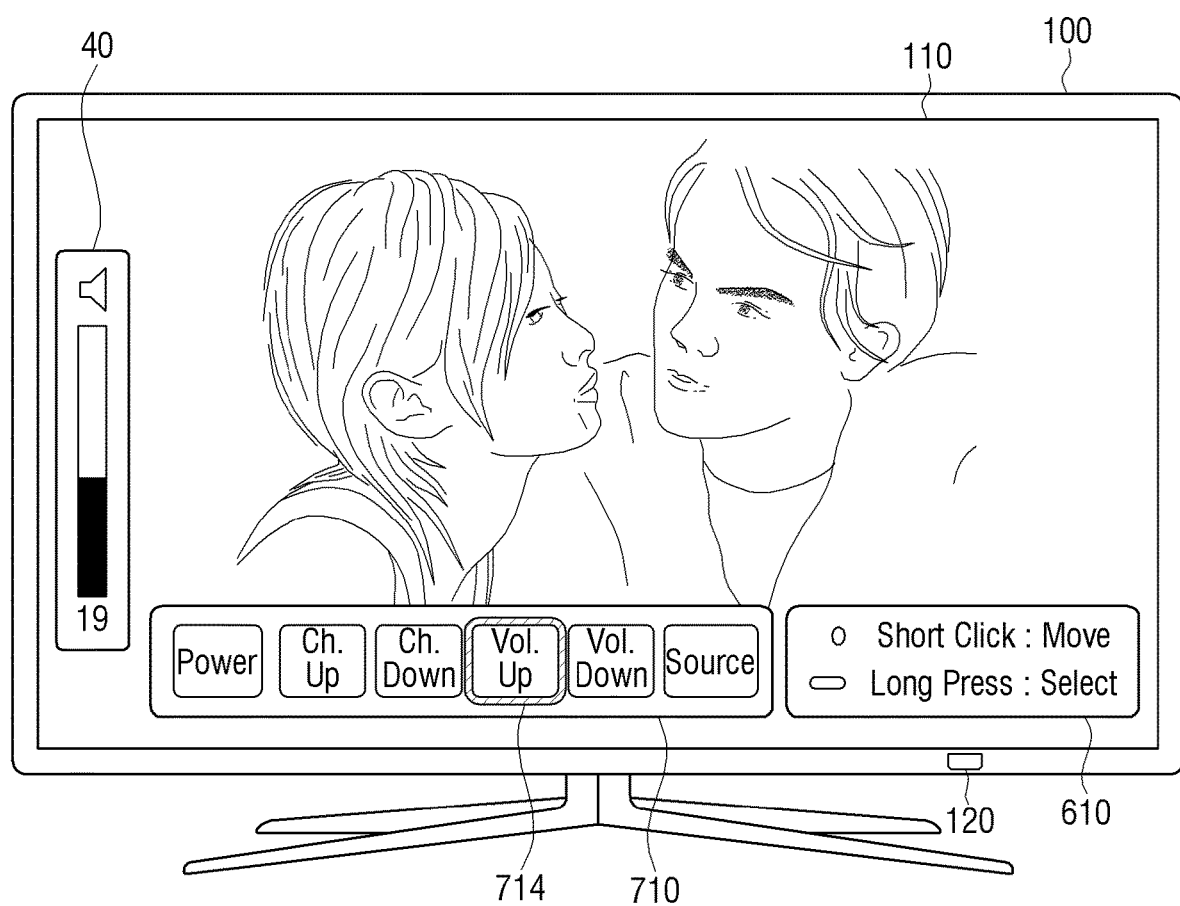

Referring to FIG. 19, the processor 130 recognizes that the long press is continuously input through the input unit 120 and may accelerate the speed of increasing the volume intensity as illustrated in FIG. 18 when the long press is continuously input in excess of the preset critical time, thereby displaying the OSD 40 indicating that the current volume intensity is changed to 19, according to an exemplary embodiment.

Figure 20:
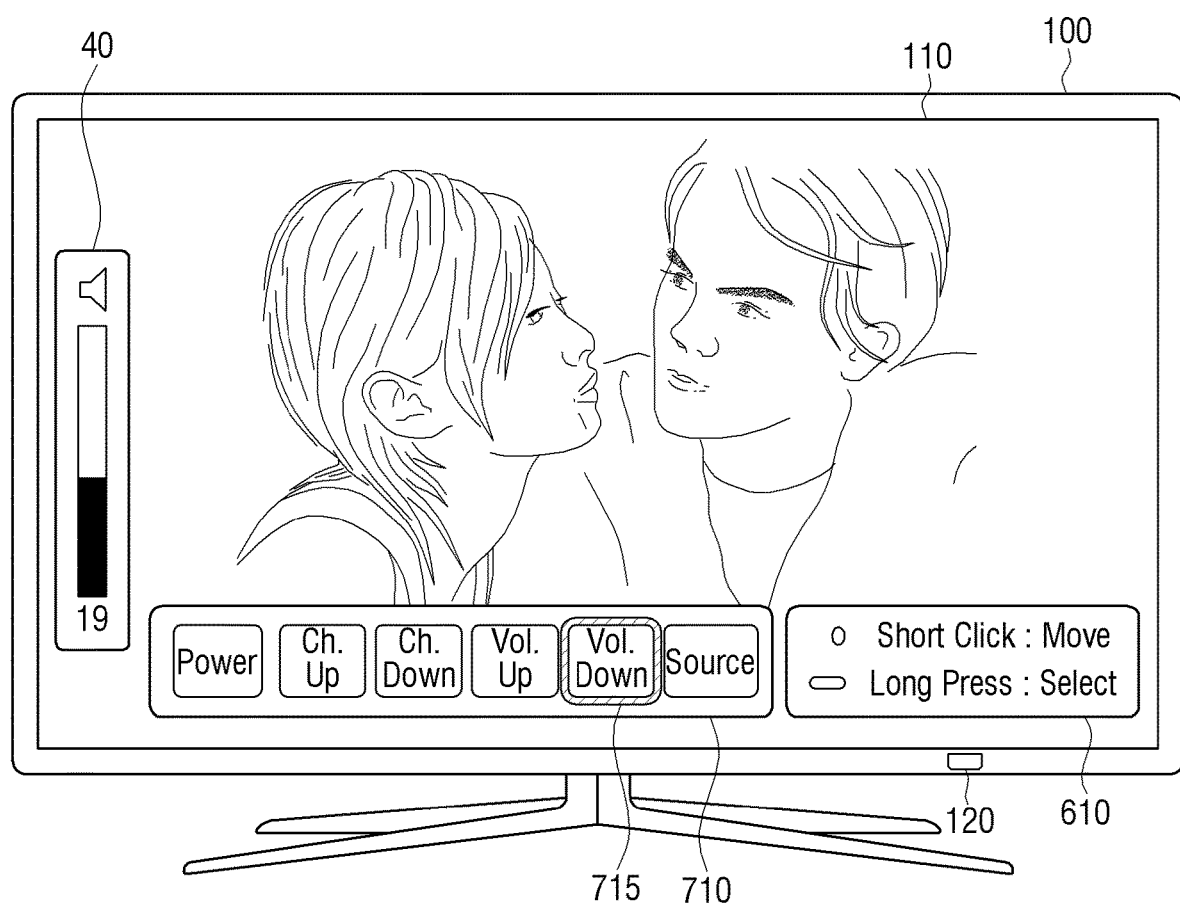

Referring to FIG. 20, the processor 130 may move the selection GUI from the volume up menu 714 included in the user interface screen 710 to the volume down menu 715 when the short click is input through the input unit 120. In this case, the processor displays the OSD 40 indicating that the current volume intensity is 19, according to an exemplary embodiment.

Figure 21:
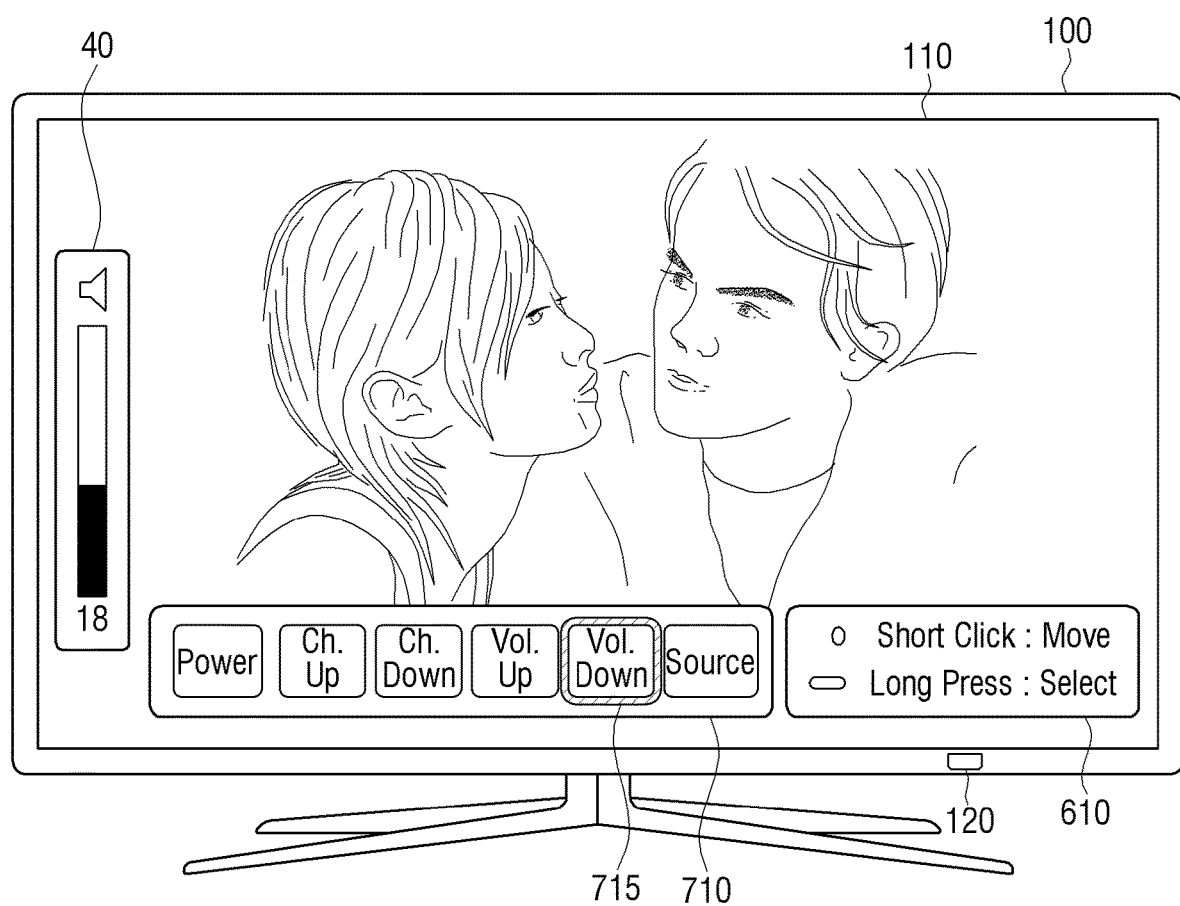

Referring to FIG. 21, the processor 130 executes the function corresponding to the volume down menu at which the selected GUI is positioned, that is, the function of lowering the volume intensity when the long press is input through the input unit 120, thereby displaying the OSD 40 indicating that the current volume intensity is 18, according to an exemplary embodiment.

Figure 22:
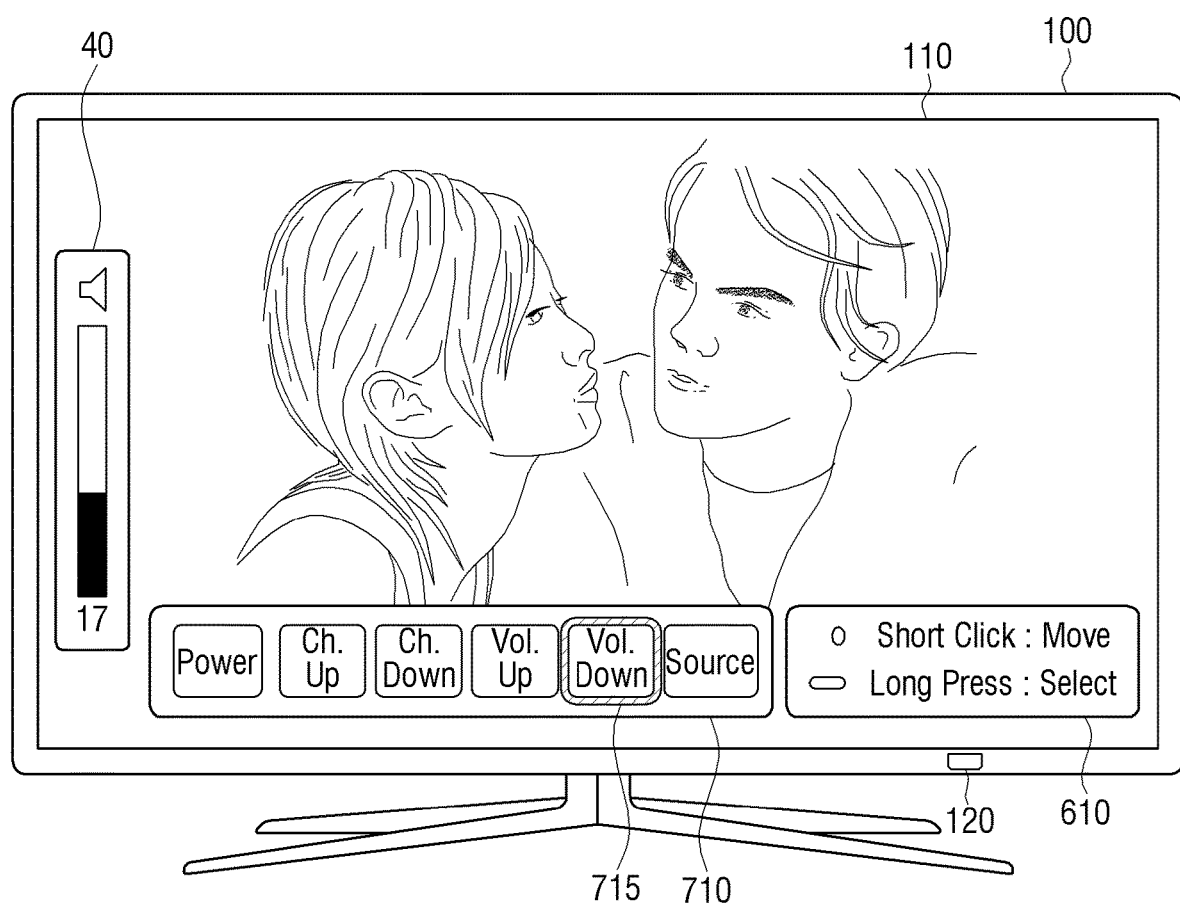

Referring to FIG. 22, the processor 130 recognizes that the long press is continuously input through the input unit 120 and performs a function of sequentially lowering continuously the volume intensity when the input time of the long press does not exceed the preset critical time, thereby displaying the OSD 40 indicating that the current volume intensity is changed to 17, according to an exemplary embodiment.

Figure 23:
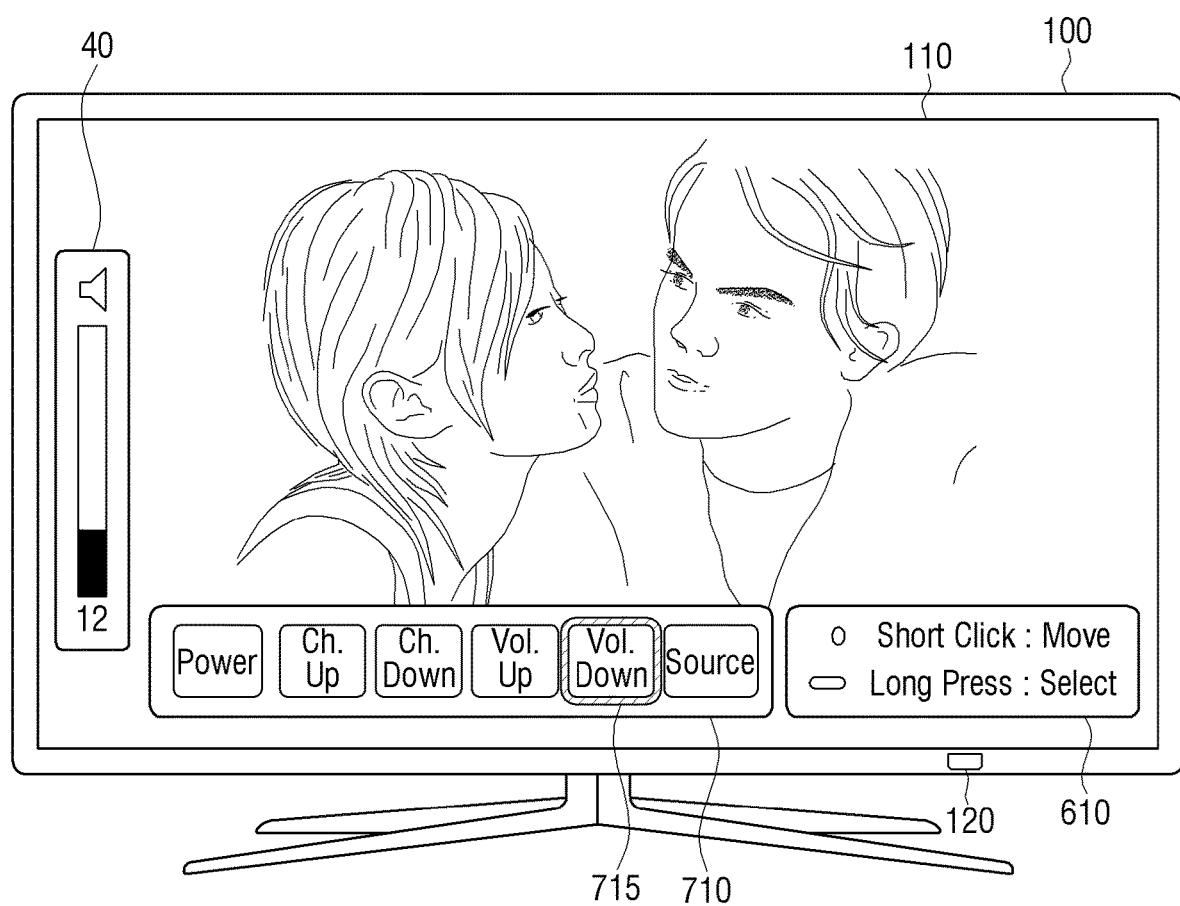

Referring to FIG. 23, the processor 130 recognizes that the long press is continuously input through the input unit 120 and may accelerate the speed of lowering the volume intensity without sequentially and continuously lowering the volume intensity when the input time of the long press exceeds the preset critical time, thereby displaying the OSD 40 indicating that the current volume intensity is changed to 12, according to an exemplary embodiment. That is, when the input time of the long press exceeds the preset critical time, the processor 130 accelerates the lowering speed without sequentially changing the volume intensity from 17 to 16 to change the volume intensity to 12.

Figure 24:
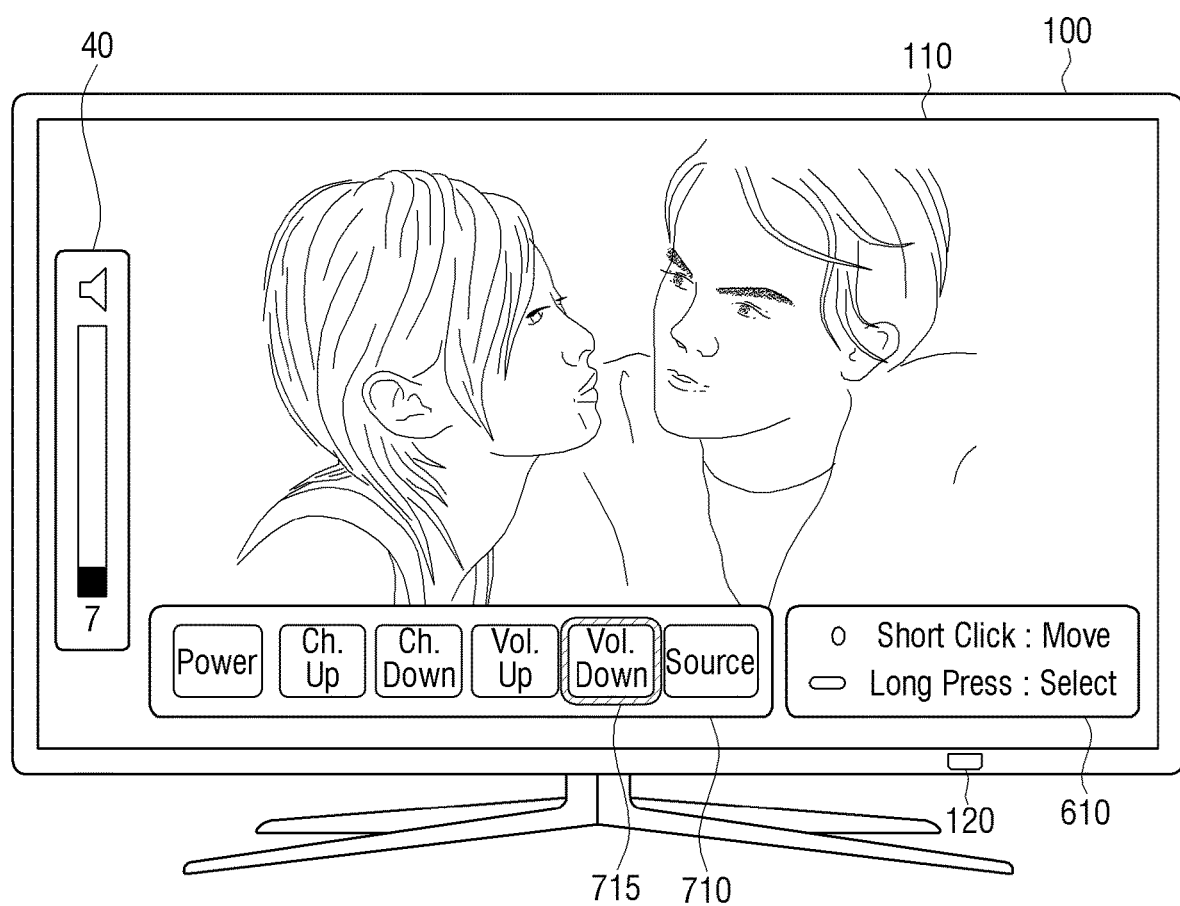

Referring to FIG. 24, the processor 130 recognizes that the long press is continuously input through the input unit 120 and may accelerate the speed of lowering the volume intensity as illustrated in FIG. 23 when the long press is continuously input in excess of the preset critical time, thereby displaying the OSD 40 indicating that the current volume intensity is 7, according to an exemplary embodiment.

Figure 25:
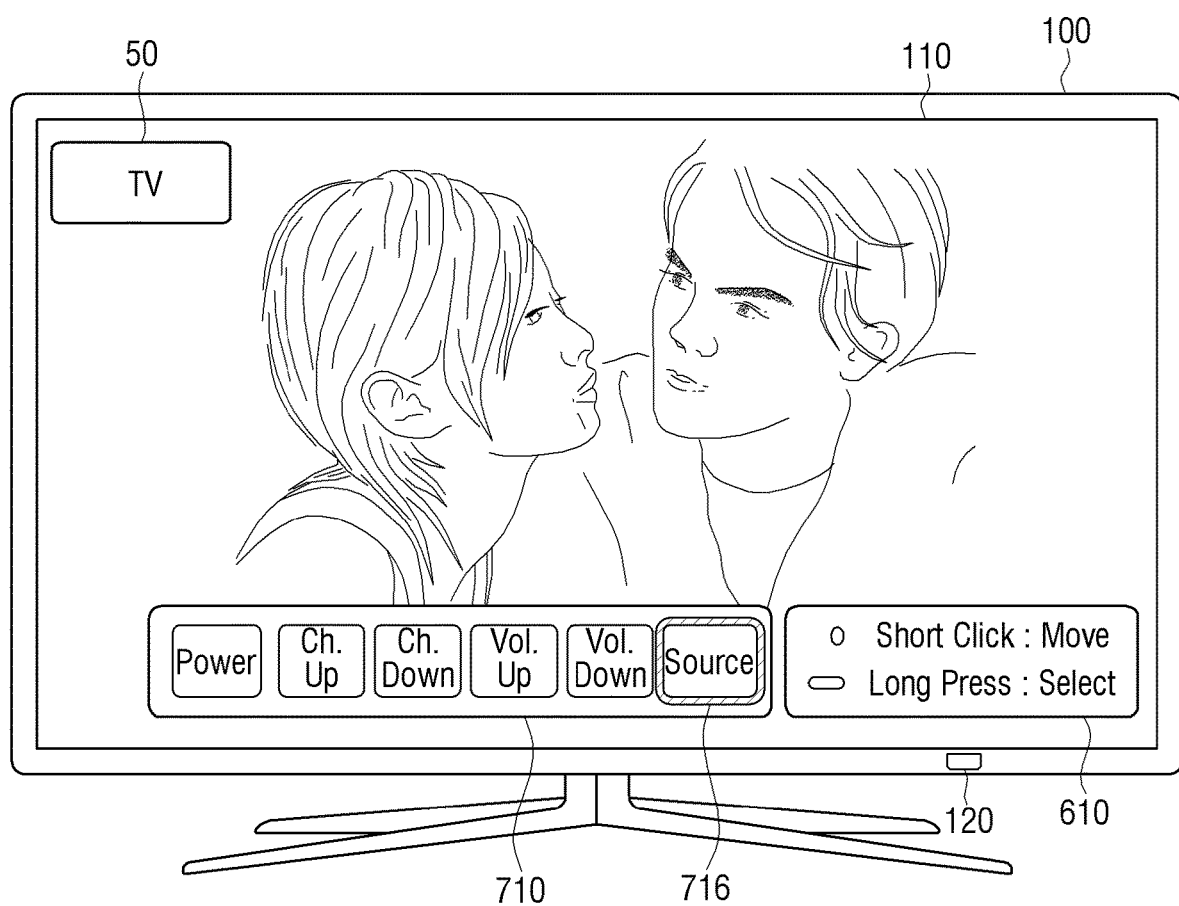
FIGS. 25 and 26 are diagrams for describing a source change, according to an exemplary embodiment.
Figure 26:
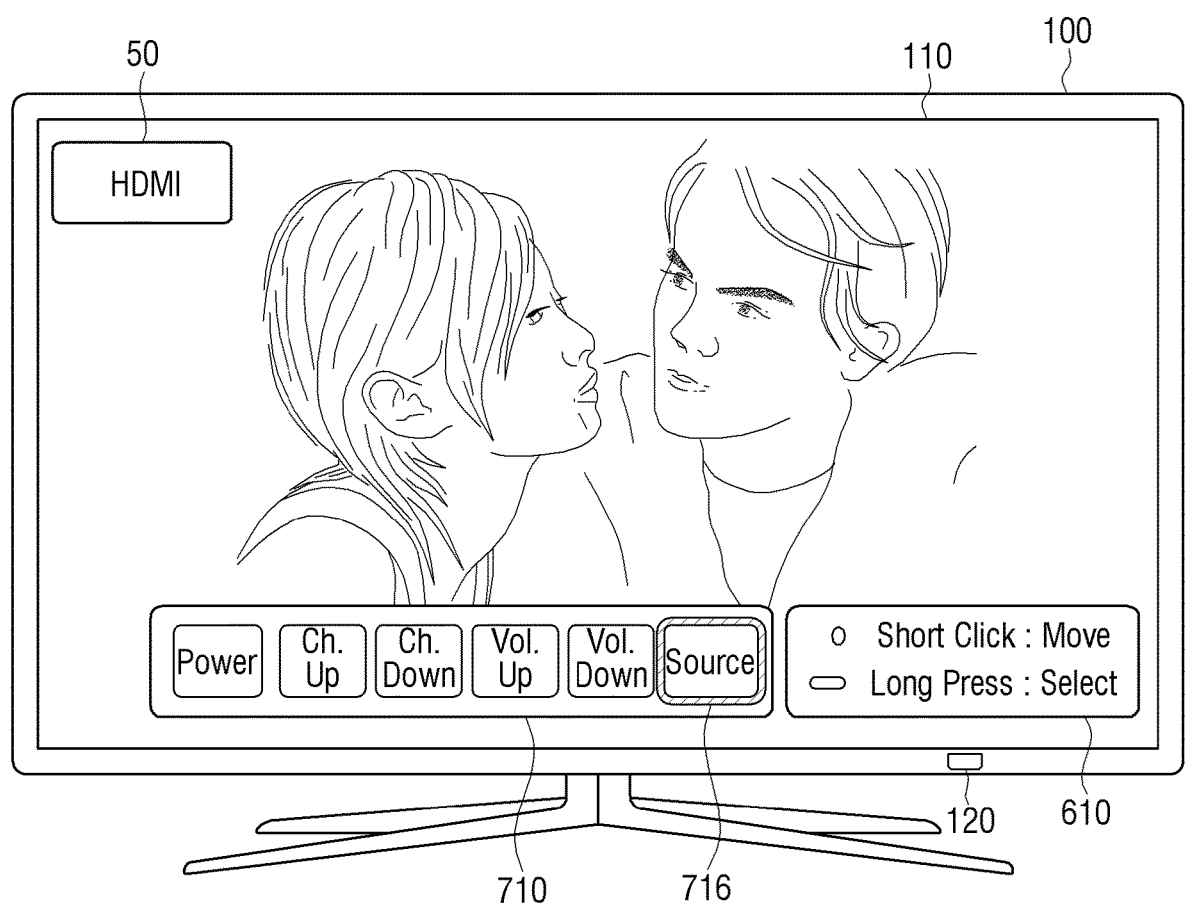

FIGS. 25 and 26 are diagrams for describing a source change, according to an exemplary embodiment.

Referring to FIG. 25, the processor 130 moves the selected GUI from the volume down menu 715 included in the user interface screen 710 to a source menu 716 when the short click is input through the input unit 120, according to an exemplary embodiment. In this case, the processor 130 may display the OSD 50 indicating a kind of current sources. It may be appreciated that the kind of current sources is TV, according to an exemplary embodiment.

Referring to FIG. 26, the processor 130 executes a function corresponding to a source menu at which the selected GUI is positioned, that is, a function of changing the kind of sources when the long press is input through the input unit 120, thereby displaying the OSD 50 indicating that the kind of current sources is changed to HDMI, according to an exemplary embodiment.

The input unit 120 may include at least one of a single physical function key and a touch panel. Here, when the input unit 120 is implemented as a single physical function key, a user presses the one physical function key and thus the processor 130 may perform the corresponding function according to the time for which the physical function key is pressed.

Similarly, even when the input unit 120 is implemented as the touch panel, the user presses the touch panel and thus the processor 130 may perform the corresponding function corresponding to the number of times the touch panel is pressed.

At least one of the single physical function key and the touch panel may be provided on a bezel portion of the display apparatus 100.

Furthermore, at least one of the one physical function key and the touch panel may be provided in the display apparatus 100 and the remote control apparatus (not illustrated) for controlling the display apparatus 100 and when the user uses at least one of the single physical function key included in the remote control apparatus (not illustrated) and the touch panel to transmit the control command to the display apparatus 100, the processor 130 of the display apparatus 100 may execute the same function as the foregoing exemplary embodiment.

FIG. 27 is a flow chart for describing a controlling method of a display, apparatus according to an exemplary embodiment.

According to the method illustrated in FIG. 27, the controlling method of a display apparatus including the input unit which receives the user operation for selecting and executing at least one menu included in the user interface screen may include displaying the user interface screen (S2710) and separately recognizing the short click and the long press based on the input time of the user operation (S2720).

Next, the execution speed of the function corresponding to the selected menu may be constantly maintained within a preset critical time, in the time for which the input of the long press is continued, and the execution speed of the corresponding function may be accelerated after the preset critical time (S2730).

The sampling section in which the input of the long press is recognized may be constantly maintained at a preset size within the preset critical time and the sampling section in which the input of the input of the long press is recognized may be changed to a size which is smaller than the preset size after the preset critical time.

Furthermore, the controlling method of a display apparatus according to the exemplary embodiment further includes creating and displaying the OSD which guides the functions corresponding to each of the short click and the long press.

The controlling method of a display apparatus further includes moving the GUI for selecting one of at least one menu included in the user interface screen when the user operation is recognized as the short click and selecting and executing the menu at which the selection GUI is positioned when the user operation is recognized as the long press.

The channel change speed is constantly maintained within the preset critical time and the channel change speed is accelerated after the preset critical time when the menu at which the selection GUI is positioned is the channel change menu, according to an exemplary embodiment.

The volume change speed is constantly maintained within the preset critical time and the volume change speed is accelerated after the preset critical time when the menu at which the selection GUI is positioned is the volume change menu, according to an exemplary embodiment.

The input unit includes at least one of the single physical function key and the touch panel and at least one of the single physical function key and the touch panel is provided on the bezel portion of the display apparatus.

As described above, according to various exemplary embodiments, it is possible to increase the operation convenience of a user by intuitively and easily operating the display apparatus.

Meanwhile, a non-transitory computer readable medium in which a program sequentially executing the controlling method according to the above described exemplary embodiments is stored, may be provided.

For example, the non-transitory computer readable medium in which programs which execute a process of displaying the user interface screen, a process of separately recognizing the short click and the long press based on the input time of the user operation, and a process of constantly maintaining the execution speed of the function corresponding to the selected menu within the preset critical time in the time for which the input of the long press is continued and accelerating the execution speed of the corresponding function after the preset critical time are stored, may be provided.

The non-transitory computer readable medium is not a medium that stores data therein for a while, such as a register, a cache, and a memory, but means a medium that semi-permanently stores data therein and is readable by a device. In detail, various applications and programs described above may be stored and provided in the non-transitory computer readable medium such as a compact disk (CD), a digital versatile disk (DVD), a hard disk, a Blu-ray disk, a universal serial bus (USB), a memory card, and a read only memory (ROM).

In addition, although buses are not illustrated in the block diagrams illustrating the display apparatus, communication between the respective components in the display apparatus may be performed through the buses. In addition, processors such as a CPU and a microprocessor which execute various processes described above may be further included in each device.

Although exemplary embodiments of the present invention have been illustrated and described hereinabove, the present invention is not limited to the above and may be variously modified by those skilled in the art to which the present invention pertains without departing from the scope and spirit of the invention as disclosed in the accompanying claims. These modifications should also be understood to fall within the scope of the present invention.

What is claimed is:

1. A display apparatus, comprising:
a display; and
a processor configured to:
control the display to display:
a plurality of menu items comprising a power menu item, a source menu item, and a volume menu item, and
an indicator for selecting a menu item of the plurality of menu items,
wherein the plurality of menu items respectively correspond to a plurality of functions for controlling the display apparatus;
receive a user operation of pressing a single key while the plurality of menu items are displayed on the display;
identify the received user operation as either a short click or a long press based on an input time of the user operation of pressing the single key;
in response to the user operation of pressing the single key being identified as the short click while the indicator is positioned on a menu item of the plurality of menu items, move the indicator from the menu item to another menu item of the plurality of menu items;
in response to the user operation of pressing the single key being identified as the long press while the indicator is positioned on a menu item of the plurality of menu items, perform a function corresponding to the menu item on which the indicator is positioned; and
maintain a speed of performing the function within a preset time for which an input of the long press is continued and accelerate the speed of performing the function after the preset time passes.

2. The display apparatus as claimed in claim 1, wherein the processor is further configured to constantly maintain a sampling section in which the user operation of the long press is received at a preset size within the preset critical time and to change the sampling section in which the user operation of the long press is received to a size which is smaller than the preset size after the preset time passes.

3. The display apparatus as claimed in claim 1, wherein the processor is further configured to create an on screen display (OSD) which guides functions corresponding to each of the short click and the long press, and control the display to display the created OSD on the display.

4. The display apparatus as claimed in claim 1, wherein the processor is further configured to constantly maintain a channel change speed within the preset time and to accelerate the channel change speed after the preset time when the menu item on which the indicator is positioned is a channel change menu item.

5. The display apparatus as claimed in claim 4, wherein the processor is further configured to constantly maintain a volume change speed within the preset time and to accelerate the volume change speed after the preset time when the menu item on which the indicator is positioned is the volume change menu item.

6. The display apparatus as claimed in claim 1, wherein the single key comprises at least one from among a single physical key and a single touch key.

7. The display apparatus as claimed in claim 6, wherein the at least one from among the single physical key and the single touch key is provided on a bezel portion of the display apparatus.

* * * * *